(12) United States Patent
Zhang

(10) Patent No.: US 11,417,256 B2
(45) Date of Patent: Aug. 16, 2022

(54) SHIFT REGISTER UNIT AND DRIVING METHOD THEREOF, GATE DRIVE CIRCUIT AND DISPLAY DEVICE

(71) Applicants: ORDOS YUANSHENG OPTOELECTRONICS CO., LTD., Ordos (CN); BOE TECHNOLOGY GROUP CO., LTD., Beijing (CN)

(72) Inventor: Jie Zhang, Beijing (CN)

(73) Assignees: ORDOS YUANSHENG OPTOELECTRONICS CO., LTD., Ordos (CN); BOE TECHNOLOGY GROUP CO., LTD., Beijing (CN)

(*) Notice: Subject to any disclaimer, the term of this patent is extended or adjusted under 35 U.S.C. 154(b) by 504 days.

(21) Appl. No.: 16/474,650

(22) PCT Filed: Dec. 28, 2018

(86) PCT No.: PCT/CN2018/124931
§ 371 (c)(1),
(2) Date: Jun. 28, 2019

(87) PCT Pub. No.: WO2019/200967
PCT Pub. Date: Oct. 24, 2019

(65) Prior Publication Data
US 2021/0358362 A1    Nov. 18, 2021

(30) Foreign Application Priority Data

Apr. 18, 2018 (CN) .......................... 201810350299.1

(51) Int. Cl.
*G09G 3/20* (2006.01)
*G11C 19/28* (2006.01)
*G09G 3/36* (2006.01)

(52) U.S. Cl.
CPC .............. *G09G 3/20* (2013.01); *G11C 19/287* (2013.01); *G09G 3/36* (2013.01); *G09G 3/3611* (2013.01);
(Continued)

(58) Field of Classification Search
CPC ............. G09G 3/20; G09G 2310/0286; G09G 2310/08; G09G 3/3611; G09G 3/36;
(Continued)

(56) References Cited

U.S. PATENT DOCUMENTS 10,002,558 B2    6/2018   Ma
10,847,237 B2 *  11/2020  Xiang .................. G09G 3/3266
(Continued)

FOREIGN PATENT DOCUMENTS

CN    105741802 A       7/2016
CN    106098002 A  *   11/2016   ........... G09G 3/3266
(Continued)

OTHER PUBLICATIONS

International Search Report and Written Opinion in corresponding International Patent Application No. PCT/CN2018/124931 dated Mar. 29, 2019. 15 pages. (English translation attached.).

*Primary Examiner* — Douglas M Wilson
(74) *Attorney, Agent, or Firm* — Leason Ellis LLP

(57) ABSTRACT

A shift register unit and a driving method thereof, a gate drive circuit, and a display device are disclosed. The shift register unit includes a first input sub-circuit, a first control sub-circuit, an output sub-circuit, and a second control sub-circuit. The first input sub-circuit is configured to output a first control signal of the first control signal terminal to the first control sub-circuit; the first control sub-circuit is configured to output a second input signal of the second input terminal to the first node, or the first control sub-circuit is configured to output the second input signal to the second (Continued)

control sub-circuit; the second control sub-circuit is configured to output a second clock signal to the second node; or the second control sub-circuit is configured to output a first voltage of the first voltage terminal to the second node under control of a level of the control node.

18 Claims, 7 Drawing Sheets

(52) U.S. Cl.
CPC ... *G09G 3/3677* (2013.01); *G09G 2300/0408* (2013.01); *G09G 2310/0283* (2013.01); *G09G 2310/0286* (2013.01); *G09G 2310/08* (2013.01); *G11C 19/28* (2013.01)

(58) Field of Classification Search
CPC ......... G09G 3/3677; G09G 2300/0408; G09G 2310/0283; G11C 19/287; G11C 19/02
See application file for complete search history.

(56) References Cited

U.S. PATENT DOCUMENTS

| | | | |
|---|---|---|---|
| 2008/0088555 | A1 | 4/2008 | Shin et al. |
| 2011/0221736 | A1* | 9/2011 | Pak ................. G09G 3/3677 345/211 |
| 2013/0027378 | A1* | 1/2013 | Lee ................. G11C 19/28 345/212 |
| 2013/0328495 | A1* | 12/2013 | Woo ................. H05B 47/10 315/224 |
| 2018/0122289 | A1 | 5/2018 | Gu et al. |
| 2018/0190201 | A1* | 7/2018 | Li ................. G09G 3/3674 |
| 2020/0090570 | A1* | 3/2020 | Feng ................. G11C 19/28 |

FOREIGN PATENT DOCUMENTS

| | | |
|---|---|---|
| CN | 106098002 A | 11/2016 |
| CN | 106228927 A | 12/2016 |
| CN | 106409207 A | 2/2017 |
| CN | 107068088 A | 8/2017 |
| CN | 107909980 A | 4/2018 |
| CN | 108520724 A | 9/2018 |

* cited by examiner

SHIFT REGISTER UNIT AND DRIVING METHOD THEREOF, GATE DRIVE CIRCUIT AND DISPLAY DEVICE

CROSS REFERENCE TO RELATED APPLICATIONS

The present application is a U.S. National Stage Application under 35 U.S.C. § 371 of International Patent Application No. PCT/CN2018/124931, filed Dec. 28, 2018, which claims priority to Chinese patent application No. 201810350299.1, filed on Apr. 18, 2018, both of which are incorporated by reference in their entireties as part of the present application.

TECHNICAL FIELD

Embodiments of the present disclosure relate to a shift register unit and a driving method thereof, a gate drive circuit and a display device.

BACKGROUND

With the continuous development of the LCD (Liquid Crystal Display) display technology and the increasingly fierce market trend, technical capabilities and performance quality of GOA (Gate driver On Array) have become more urgent. The stability of GOA is also a consideration emphasis for a technology barrier of performance of a GOA circuit.

SUMMARY

At least one embodiment of the present disclosure provides a shift register unit including a first input sub-circuit, a first control sub-circuit, an output sub-circuit, and a second control sub-circuit. The first input sub-circuit is connected with a first input terminal, a first control signal terminal and the first control sub-circuit, and the first input sub-circuit is configured to output a first control signal of the first control signal terminal to the first control sub-circuit under control of a first input signal of the first input terminal; the first control sub-circuit is connected with a second input terminal, a first node and the second control sub-circuit, the first control sub-circuit is configured to output a second input signal of the second input terminal to the first node under control of the first control signal output by the first input sub-circuit, or the first control sub-circuit is configured to output the second input signal to the second control sub-circuit; the output sub-circuit is connected with the first node and an output terminal, and the output sub-circuit is configured to output an output signal to the output terminal under control of a level of the first node; and the second control sub-circuit is connected with a second clock signal terminal, a second node, a control node and a first voltage terminal, the second control sub-circuit is configured to output a second clock signal to the second node under control of the second clock signal of the second clock signal terminal, or the second control sub-circuit is configured to output a first voltage of the first voltage terminal to the second node under control of a level of the control node.

For example, a shift register unit provided by an embodiment of the present disclosure further includes a noise reduction sub-circuit. The noise reduction sub-circuit is connected with the second node, the first node, the first voltage terminal and the output terminal, and the noise reduction sub-circuit is configured to output the first voltage of the first voltage terminal to the first node and the output terminal under control of a level of the second node.

For example, in a shift register unit provided by an embodiment of the present disclosure, first input sub-circuit includes a first transistor. A gate electrode of the first transistor is connected with the first input terminal to receive the first input signal, a first electrode of the first transistor is connected with the first control signal terminal to receive the first control signal, and a second electrode of the first transistor is connected with the first control sub-circuit and is used as an output terminal of the first input sub-circuit.

For example, in a shift register unit provided by an embodiment of the present disclosure, the first control sub-circuit includes a second transistor and a third transistor. A gate electrode of the second transistor is connected with an output terminal of the first input sub-circuit, a first electrode of the second transistor is connected with the second input terminal to receive the second input signal, and a second electrode of the second transistor is connected with the control node; and a gate electrode of the third transistor is electrically connected with a first electrode of the third transistor, the gate electrode of the third transistor and the first electrode of the third transistor are configured to be connected with the control node respectively, and a second electrode of the third transistor is connected with the first node.

For example, in a shift register unit provided by an embodiment of the present disclosure, the output sub-circuit includes a fourth transistor and a first capacitor. A gate electrode of the fourth transistor is connected with the first node, a first electrode of the fourth transistor is connected with a first clock signal terminal to receive a first clock signal as the output signal, and a second electrode of the fourth transistor is connected with the output terminal; and a first terminal of the first capacitor is connected with the first node, and a second terminal of the first capacitor is connected with the output terminal.

For example, in a shift register unit provided by an embodiment of the present disclosure, the second control sub-circuit includes a fifth transistor, a sixth transistor, and a second capacitor. A gate electrode of the fifth transistor is connected with a first electrode of the fifth transistor, the gate electrode of the fifth transistor and the first electrode of the fifth transistor are respectively configured to be connected with the second clock signal terminal to receive the second clock signal, and a second electrode of the fifth transistor is connected with the second node; a gate electrode of the sixth transistor is connected with the control node, a first electrode of the sixth transistor is connected with the second node, and a second electrode of the sixth transistor is connected with the first voltage terminal to receive the first voltage; and a first terminal of the second capacitor is connected with the second node, and a second terminal of the second capacitor is connected with the first voltage terminal to receive the first voltage.

For example, in a shift register unit provided by an embodiment of the present disclosure, the noise reduction sub-circuit includes a seventh transistor and an eighth transistor. A gate electrode of the seventh transistor is connected with the second node, a first electrode of the seventh transistor is connected with the first node, and a second electrode of the seventh transistor is connected with the first voltage terminal to receive the first voltage; and a gate electrode of the eighth transistor is connected with the second node, a first electrode of the eighth transistor is connected with the output terminal, and a second electrode of the eighth transistor is connected with the first voltage terminal to receive the first voltage.

For example, a shift register unit provided by an embodiment of the present disclosure further includes a second input sub-circuit. The second input sub-circuit is connected with a third input terminal, a fourth input terminal, a second control signal terminal, and the control node, and the second input sub-circuit is configured to output a fourth input signal of the fourth input terminal to the control node, under control of a third input signal of the third input terminal and a second control signal of the second control signal terminal.

For example, in a shift register unit provided by an embodiment of the present disclosure, the second input sub-circuit includes a ninth transistor and a tenth transistor. A gate electrode of the ninth transistor is connected with the third input terminal to receive the third input signal, a first electrode of the ninth transistor is connected with the second control signal terminal to receive the second control signal, and a second electrode of the ninth transistor is connected with a gate electrode of the tenth transistor; and a first electrode of the tenth transistor is connected with the fourth input terminal to receive the fourth input signal, and a second electrode of the tenth transistor is connected with the control node.

At least one embodiment of the present disclosure further provides a shift register unit including a first transistor, a second transistor, a third transistor, a fourth transistor, a fifth transistor, a sixth transistor, a first capacitor, and a second capacitor. A gate electrode of the first transistor is connected with a first input terminal to receive a first input signal, a first electrode of the first transistor is connected with a first control signal terminal to receive a first control signal, and a second electrode of the first transistor is connected with a gate electrode of the second transistor; a first electrode of the second transistor is connected with a second input terminal to receive a second input signal, and a second electrode of the second transistor is connected with a gate electrode of the third transistor, a first electrode of the third transistor, and a gate electrode of the sixth transistor; a second electrode of the third transistor is connected with a first node; a gate electrode of the fourth transistor is connected with the first node, a first electrode of the fourth transistor is connected with a first clock signal terminal to receive a first clock signal, and a second electrode of the fourth transistor is connected with an output terminal; a first terminal of the first capacitor is connected with the first node, and a second terminal of the first capacitor is connected with the output terminal; a gate electrode of the fifth transistor is connected with a first electrode of the fifth transistor, the gate electrode of the fifth transistor is configured to be connected with a second clock signal terminal to receive a second clock signal, and a second electrode of the fifth transistor is connected with a second node; a first electrode of the sixth transistor is connected with the second node, and a second electrode of the sixth transistor is connected with a first voltage terminal to receive a first voltage; and a first terminal of the second capacitor is connected with the second node, and a second terminal of the second capacitor is connected with the first voltage terminal to receive the first voltage.

For example, a shift register unit provided by an embodiment of the present disclosure further includes a seventh transistor and an eighth transistor. A gate electrode of the seventh transistor is connected with the second node, a first electrode of the seventh transistor is connected with the first node, and a second electrode of the seventh transistor is connected with the first voltage terminal to receive the first voltage; and a gate electrode of the eighth transistor is connected with the second node, a first electrode of the eighth transistor is connected with the output terminal, and a second electrode of the eighth transistor is connected with the first voltage terminal to receive the first voltage.

For example, a shift register unit provided by an embodiment of the present disclosure further includes a ninth transistor and a tenth transistor. A gate electrode of the ninth transistor is connected with a third input terminal to receive a third input signal, a first electrode of the ninth transistor is connected with a second control signal terminal to receive a second control signal, and a second electrode of the ninth transistor is connected with the second electrode of the first transistor, the gate electrode of the second transistor, and a gate electrode of the tenth transistor; and a first electrode of the tenth transistor is connected with a fourth input terminal to receive a fourth input signal, and a second electrode of the tenth transistor is connected with the gate electrode of the third transistor, the first electrode of the third transistor, and the gate electrode of the sixth transistor.

For example, in a shift register unit provided by an embodiment of the present disclosure, the first transistor to the tenth transistor are all N-type transistors or P-type transistors.

At least one embodiment of the present disclosure further provides a driving method of the shift register unit, and the driving method includes: in an input phase, via the first input sub-circuit, outputting the first control signal of the first control signal terminal to the first control sub-circuit under control of the first input signal of the first input terminal, and via the second control sub-circuit, outputting the second clock signal of the second clock signal terminal to the second node under control of the second clock signal of the second clock signal terminal; in a pre-charging phase, via the first control sub-circuit, outputting the second input signal of the second input terminal to the first node under control of the first control signal output by the first input sub-circuit; and via the first control sub-circuit, further outputting the second input signal of the second input terminal to the second control sub-circuit, and via the second control sub-circuit, outputting the first voltage of the first voltage terminal to the second node under control of the second input signal of the second input terminal; and in an output phase, via the output sub-circuit, outputting the output signal to the output terminal under control of the level of the first node.

For example, in a gate drive circuit provided by an embodiment of the present disclosure, the shift register unit further includes a noise reduction sub-circuit, and the driving method further includes a reset phase. In the input phase, via the noise reduction sub-circuit, outputting the first voltage of the first voltage terminal to the first node and the output terminal under control of the level of the second node; and in the reset phase, via the second control sub-circuit, outputting the second clock signal to the second node under control of the second clock signal of the second clock signal terminal, and via the noise reduction sub-circuit, outputting the first voltage of the first voltage terminal to the first node and the output terminal under control of the level of the second node.

At least one embodiment of the present disclosure further provides a driving method of the shift register unit, and the driving method includes: in an input phase, via the second input sub-circuit, outputting the second control signal of the second control signal terminal under control of the third input signal of the third input terminal, and via the second control sub-circuit, outputting the second clock signal of the second clock signal terminal to the second node under control of the second clock signal of the second clock signal terminal; in a pre-charging phase, via the second input sub-circuit, outputting the fourth input signal of the fourth input terminal to the control node under control of the second control signal, and via the first control sub-circuit, outputting the fourth input signal of the fourth input terminal to the first node; and via the first control sub-circuit, further outputting the fourth input signal of the fourth input terminal to the second control sub-circuit, and via the second control sub-circuit, outputting the first voltage of the first voltage terminal to the second node under control of the fourth input signal of the fourth input terminal; and in an output phase, via the output sub-circuit, outputting the output signal to the output terminal under control of the level of the first node.

At least one embodiment of the present disclosure further provides a gate drive circuit, and the gate drive circuit includes a plurality of cascaded shift register units provided by any one of embodiments of the present disclosure. A first input terminal of a first-stage of the shift register units and a first input terminal of a second-stage of the shift register units are connected with a first signal terminal; except the first-stage of the shift register units and the second-stage of the shift register units, a first input terminal of an (N)th-stage of the shift register units is connected with an output terminal of an (N−2)th-stage of the shift register units; a second input terminal of the first-stage of the shift register units is connected with a second signal terminal, and except the first-stage of the shift register units, a second input terminal of the (N)th-stage of the shift register units is connected with an output terminal of an (N−1)th-stage of the shift register units; and N is an integer greater than or equal to 3.

For example, in a gate drive circuit provided by an embodiment of the present disclosure, in a case where the shift register unit includes a second input sub-circuit, or includes a ninth transistor and a tenth transistor, except last two stages of the shift register units, a third input terminal of the (N)th-stage of the shift register units is connected with an output terminal of an (N+2)th-stage of the shift register units; except a last-stage of the shift register units, a fourth input terminal of the (N)th-stage of the shift register units is connected with an output terminal of an (N+1)th-stage of the shift register units; and third input terminals of the last two stages of the shift register units are connected with the first signal terminal, and a fourth input terminal of the last-stage of the shift register units is connected with the second signal terminal.

At least one embodiment of the present disclosure further provides a display device, and the display device includes the gate drive circuit provided by any one of embodiments of the present disclosure.

BRIEF DESCRIPTION OF THE DRAWINGS

In order to demonstrate clearly technical solutions of the embodiments of the present disclosure, the accompanying drawings in relevant embodiments of the present disclosure will be introduced briefly. It is apparent that the drawings may only relate to some embodiments of the disclosure. For those of ordinary skill in the art, other drawings can be obtained according to these drawings without creative labor.

DETAILED DESCRIPTION

Figure 1:
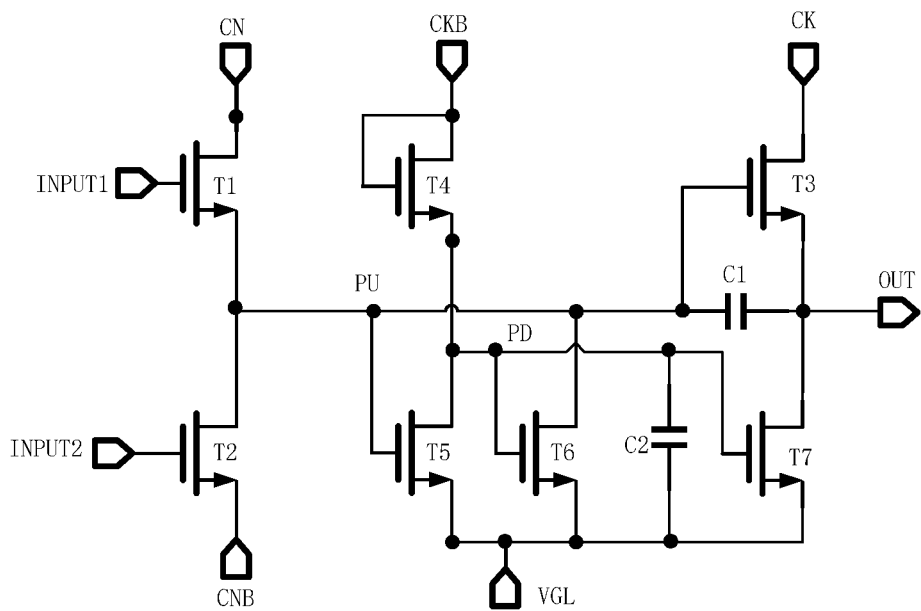
FIG. 1 is a circuit schematic diagram of a GOA unit.

In order to make objects, technical details and advantages of the embodiments of the disclosure apparent, the technical solutions of the embodiment will be described in a clearly and fully understandable way in connection with the drawings related to the embodiments of the disclosure. It is apparent that the described embodiments are just a part but not all of the embodiments of the disclosure. Based on the described embodiments herein, those skilled in the art can obtain other embodiment, without any creative work, which shall be within the scope of the disclosure.

Unless otherwise defined, all the technical and scientific terms used herein have the same meanings as commonly understood by one of ordinary skill in the art to which the present disclosure belongs. The terms, such as "first," "second," or the like, which are used in the description and the claims of the present disclosure, are not intended to indicate any sequence, amount or importance, but for distinguishing various components. The terms, such as "comprise/comprising," "include/including," or the like are intended to specify that the elements or the objects stated before these terms encompass the elements or the objects and equivalents thereof listed after these terms, but not preclude other elements or objects. The terms, such as "connect/connecting/connected," "couple/coupling/coupled" or the like, are not limited to a physical connection or mechanical connection, but may include an electrical connection/coupling, directly or indirectly. The terms, "on," "under," "left," "right," or the like are only used to indicate relative position relationship, and when the position of the object which is described is changed, the relative position relationship may be changed accordingly.

The present disclosure is presented below with reference to some specific embodiments. In order to keep the following descriptions of the embodiments of the present disclosure clear and concise, detailed descriptions of known functions and known components may be omitted. In a case where any component of the embodiments of the present disclosure appears in more than one of the drawings, the component is denoted by a same or similar reference numeral in each drawing.

FIG. 1 is a circuit schematic diagram of a GOA unit. Hereinafter, an example in which each transistor of the GOA unit is an N-type transistor will be described. For example, when charging a first node PU, a first input terminal INPUT1 is at a high level, so that a first transistor T1 is turned on, and at this time, the first node PU is charged. A fifth transistor T5 is turned on under control of the first node PU, thereby causing a second node PD to be connected with a low voltage terminal VGL. Meanwhile, in this phase, a clock signal terminal CKB provides a high level, so that a fourth transistor T4 is turned on, and the high level provided by the clock signal terminal CKB is outputted to the second Node PD. At this time, because the high level provided by the clock signal terminal CKB and a low level of the low voltage terminal VGL are simultaneously input to the second node PD, a DC path is formed.

In a case where the DC path is formed, a high level of the first node PU is used to pull down a level of the second node PD by controlling the fifth transistor T5 to be turned on, and the fourth transistor T4 is turned on under control of the high level of the second clock signal terminal CKB. For example, in a case where conduction parameters of the fourth transistor T4 and the fifth transistor T5 are not set, the second node PD may be at a high level, and a sixth transistor T6 is turned on in response to the high level of the second node PD, thereby pulling down the level of the first node PU, and causing a potential of the first node PU and a potential of the second node PD to compete with each other.

Therefore, in one aspect, the above-mentioned DC path leads to an increase in power consumption of a gate drive circuit including a plurality of cascaded GOA units; and in another aspect, the DC path is a bad phenomenon of the GOA unit, which may pull down a voltage of a clock signal, and cause an insufficient charging of the second node PD of a GOA unit in a stage, resulting in the GOA unit in the stage not working properly, thereby reducing the stability of the GOA unit.

At least one embodiment of the present disclosure provides a shift register unit, and the shift register unit includes a first input sub-circuit, a first control sub-circuit, an output sub-circuit, and a second control sub-circuit. The first input sub-circuit is connected with a first input terminal, a first control signal terminal and the first control sub-circuit, and the first input sub-circuit is configured to output a first control signal of the first control signal terminal to the first control sub-circuit under control of a first input signal of the first input terminal. The first control sub-circuit is connected with a second input terminal, a first node and the second control sub-circuit, the first control sub-circuit is configured to output a second input signal of the second input terminal to the first node under control of the first control signal output by the first input sub-circuit, or the first control sub-circuit is configured to output the second input signal to the second control sub-circuit. The output sub-circuit is connected with the first node and an output terminal, and the output sub-circuit is configured to output an output signal to the output terminal under control of a level of the first node. The second control sub-circuit is connected with a second clock signal terminal, a second node, a control node and a first voltage terminal, the second control sub-circuit is configured to output a second clock signal to the second node under control of the second clock signal of the second clock signal terminal; or the second control sub-circuit is configured to output a first voltage of the first voltage terminal to the second node under control of a level of the control node. Embodiments of the present disclosure further provide a gate drive circuit, a display device, and a driving method corresponding to the above-described shift register unit.

The shift register unit provided by the embodiment of the present disclosure can avoid to appear to a phenomenon that the potential of the first node competes with the potential of the second node during the operation process of the shift register unit, thereby reducing the power consumption of a gate drive circuit including a plurality of cascaded shift register units and improving the stability of the gate drive circuit.

Embodiments of the present disclosure and examples thereof will be described in detail below with reference to the accompanying drawings.

Figure 2:
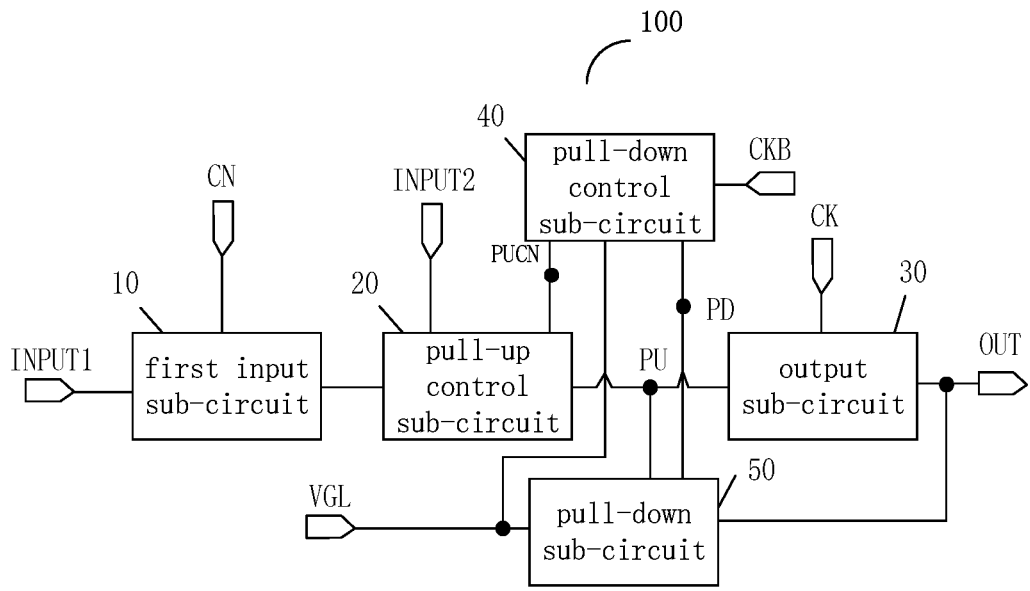
FIG. 2 is a block schematic diagram of a shift register unit provided by at least one embodiment of the present disclosure.

At least one embodiment of the present disclosure provides a shift register unit (also referred to as a GOA unit) including a first input sub-circuit, a first control sub-circuit, an output sub-circuit, and a second control sub-circuit. As shown in FIG. 2, in an example, the shift register unit 100 includes a first input sub-circuit 10, a pull-up control sub-circuit 20, an output sub-circuit 30, and a pull-down control sub-circuit 40. It should be noted that the pull-up control sub-circuit 20 in the embodiment of the present disclosure is an example of the first control sub-circuit, and the pull-down control sub-circuit 40 is an example of the second control sub-circuit, and the following is described by an example in which the first control sub-circuit is the pull-up control sub-circuit 20 and the second control sub-circuit is the pull-down control sub-circuit 40. However, the embodiments of the present disclosure are not limited thereto, and the following embodiments are the same as this case, and are not described again.

For example, the first input sub-circuit 10 is connected with a first input terminal INPUT1, a first control signal terminal CN and the pull-up control sub-circuit 20, and the first input sub-circuit 10 is configured to output a first control signal of the first control signal terminal CN to the pull-up control sub-circuit 20 under control of a first input signal of the first input terminal INPUT1, thereby controlling the pull-up control sub-circuit 20 to be turned on.

For example, the pull-up control sub-circuit 20 is connected with the second input terminal INPUT2, a first node PU, and the pull-down control sub-circuit 40. For example, the pull-up control sub-circuit 20 is configured to be turned on under control of the first control signal output by the first input sub-circuit 10, and is configured to connect the second input terminal INPUT2 with the first node PU, thereby outputting a second input signal of the second input terminal INPUT2 to the first node PU to charge (e.g., pull up) the first node PU; or the pull-up control sub-circuit 20 is configured to, in a case where the pull-up control sub-circuit 20 is turned on under control of the first control signal output by the first input sub-circuit 10, connect the second input terminal INPUT2 with the pull-down control sub-circuit 40, so that the second input signal of the second input terminal INPUT2 is output to the pull-down control sub-circuit 40, so that the pull-down control sub-circuit 40 is turned on in response to the second input signal, thereby causing the first node PU to be connected with a first voltage terminal VGL or a separately provided voltage terminal (for example, a low voltage terminal, providing a low-level signal). It should be noted that the first voltage terminal VGL, for example, can be configured to continue to input a DC low-level signal, for example, the DC low-level signal is referred to as a first voltage.

The output sub-circuit 30 is connected with the first node PU and an output terminal OUT, and the output sub-circuit 30 is configured to output an output signal to the output terminal OUT under control of a level of the first node PU. For example, the output sub-circuit 30 is connected with a first clock signal terminal CK, the first node PU, and the output terminal OUT, and is configured to be turned on under control of the level of the first node PU, so that the first clock signal terminal CK is connected with the output terminal OUT, and the first clock signal of the first clock signal terminal CK can be output as the output signal to the output terminal OUT.

For example, the pull-down control sub-circuit 40 is connected with the second input terminal INPUT2 through the pull-up control sub-circuit 20. For example, the pull-down control sub-circuit 40 is connected with a second clock signal terminal CKB, a second node PD, a control node PUCN, and the first voltage terminal VGL, and the pull-down control sub-circuit 40 is configured to be partially turned on under control of a second clock signal of the second clock signal terminal CKB, thereby causing the second clock signal terminal CKB to be connected with the second node PD, and outputting the second clock signal of the second clock signal terminal CKB to the second node PD to charging the second node PD to a high level. Or the pull-down control sub-circuit 40 is configured to be partially turned on under control of a level of the control node PUCN (i.e., the second input signal of the second input terminal INPUT2), thereby causing the second node PD to be connected with the first voltage terminal VGL or a separately provided voltage terminal (for example, a low voltage terminal, providing a low-level signal), and outputting the first voltage of the first voltage terminal VGL to the second node PD. For example, by controlling the timing of the first input signal of the first input terminal INPUT1, the second input signal of the second input terminal INPUT2, and the second clock signal of the second clock signal terminal CKB, the second clock signal of the second clock signal terminal CKB and the first voltage of the first voltage terminal VGL can control the second node PD time-divisionally, thereby avoiding the pull-down control sub-circuit 40 from being fully turned on to cause a DC path from the second clock signal terminal CKB to the first voltage terminal VGL, thereby reducing the power consumption of a gate drive circuit including a plurality of cascaded shift register units, and improving the stability of the circuit structure of the gate drive circuit.

For example, in another example, the shift register unit 100 further includes a noise reduction sub-circuit. For example, as shown in FIG. 2, the shift register unit 100 further includes a pull-down sub-circuit 50. It should be noted that, the pull-down sub-circuit 50 is an example of the noise reduction sub-circuit, in the following, the pull-down sub-circuit 50 is described by taking the noise reduction sub-circuit as an example. However, the embodiments of the present disclosure are not limited thereto, and the following embodiments are the same as those described herein, and details are not described again.

The pull-down sub-circuit 50 is connected with the second node PD, the first node PU, the first voltage terminal VGL, and the output terminal OUT, and the pull-down sub-circuit 50 is configured to be turned on under control of a level of the second node PD, such that the first node PU and the output terminal OUT are connected with the first voltage terminal VGL, so that the first voltage of the first voltage terminal VGL is output to the first node PU and the output terminal OUT, in order to achieve noise reduction.

Based on this case, in a case where the shift register unit provided by the embodiment of the present disclosure is in an input phase, the first input sub-circuit 10 outputs the first control signal of the first control signal terminal CN to the first control sub-circuit 20 under control of the first input signal of the first input terminal INPUT1; the pull-down control sub-circuit 40 outputs the second clock signal of the second clock signal terminal CKB to the second node PD under control of the second clock signal of the second clock signal terminal CKB; and the pull-down sub-circuit 50 outputs the first voltage of the first voltage terminal to the first node PU under control of the level of the second node PD, thereby achieving noise reduction. In a pre-charging phase, the pull-up control sub-circuit 20 outputs the second input signal of the second input terminal INPUT2 to the first node PU under control of the first control signal output by the first input sub-circuit 10; and the pull-up control sub-circuit 20 further outputs the second input signal of the second input terminal INPUT2 to the pull-down control sub-circuit 40, and the pull-down control sub-circuit 40 outputs the first voltage of the first voltage terminal VGL to the second node PD under control of the second input signal of the second input terminal INPUT2, thereby the level of the second node PD is pulled down to ensure normal charging of the first node PU in this stage.

In summary, the high-level signal provided by the second clock signal terminal CKB can be input to the second node PD in the input phase, and the first voltage of the first voltage terminal VGL can be input to the second node PD in the pre-charging phase, therefore, a case, where the high level of the clock signal terminal CKB and the low level of the first voltage terminal VGL form a DC path, does not occur, that is, the problem that the potential of the first node PU and the potential of the second node PD compete with each other to increase the power consumption of the circuit is avoided, and the stability of the shift register unit can also be improved.

A circuit structure of the shift register unit as shown in FIG. 2 is schematically described below in combination with FIG. 3.

The first input sub-circuit 10 includes a first transistor T1, a gate electrode of the first transistor T1 is connected with the first input terminal INPUT1 to receive the first input signal, a first electrode of the first transistor T1 is connected with the first control signal terminal CN to receive the first control signal, and a second electrode of the first transistor T1 is used as an output terminal of the first input sub-circuit 10 and is connected with the pull-up control sub-circuit 20. For example, in a case where the first input signal provided by the first input terminal INPUT1 is at an effective level, the first transistor is turned on, so that the pull-up control sub-circuit 20 is connected with the first control signal terminal CN, thereby the pull-up control sub-circuit 10 is turned on under control of the first control signal provided by the first control signal terminal CN.

Figure 6:
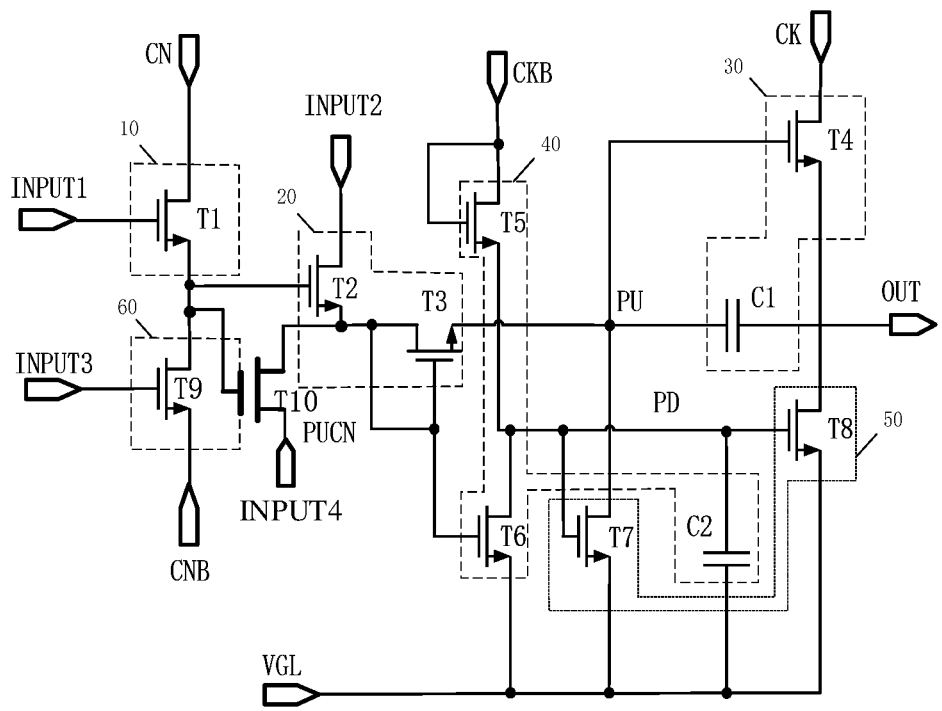
FIG. 6 is a circuit structure schematic diagram of the shift register unit as shown in FIG. 3 including a second input sub-circuit.

The pull-up control sub-circuit 20 includes a second transistor T2 and a third transistor T3. A gate electrode of the second transistor T2 is connected with the output terminal of the first input sub-circuit 10, that is, the gate electrode of the second transistor T2 is connected with the second electrode of the first transistor T1, a first electrode of the second transistor T2 is connected with the second input terminal INPUT2 to receive the second input signal, and a second electrode of the second transistor T2 is connected with the control node PUCN, that is, the second electrode of the second transistor T2 is connected with a gate electrode of the third transistor T3, a first electrode of the third transistor T3 and the pull-down control sub-circuit 40, i.e., a gate electrode of a sixth transistor T6 as shown in FIG. 6. For example, the gate electrode of the third transistor and the first electrode of the third transistor are electrically connected with each other, and are configured to be connected with the control node PUCN respectively, and a second electrode of the third transistor T3 is connected with the first node PU.

The output sub-circuit 30 includes a fourth transistor T4 and a first capacitor C1. A gate electrode of the fourth transistor T4 is connected with to the first node PU, a first electrode of the fourth transistor T4 is connected with the first clock signal terminal CK to receive the first clock signal and the first clock signal is used as the output signal, and a second electrode of the fourth transistor T4 is connected with the output terminal OUT. A first terminal of the first capacitor C1 is connected with the first node PU, a second terminal of the first capacitor C1 is connected with the output terminal OUT. In a case where the level of the first node PU is at an effective level, the fourth transistor T4 is turned on, thereby outputting the first clock signal to the output terminal OUT. Because the first capacitor C1 has a bootstrap function, it is advantageous to better output the high level of the first clock signal.

The pull-down control sub-circuit 40 includes a fifth transistor T5, a sixth transistor T6, and a second capacitor C2. A gate electrode of the fifth transistor T5 and a first electrode of the fifth transistor T5 are electrically connected with each other, and are respectively configured to be connected with the second clock signal terminal CKB to receive the second clock signal, and a second electrode of the fifth transistor T5 is connected with the second node PD. A gate electrode of the sixth transistor T6 is connected with the control node PUCN (that is, the pull-up control sub-circuit 20), a first electrode of the sixth transistor T6 is connected with the second node PD, and a second electrode of the sixth transistor T6 is connected with the first voltage terminal VGL to receive the first voltage. A first terminal of the second capacitor C2 is connected with the second node PD, and a second terminal of the second capacitor C2 is connected with the first voltage terminal VGL to receive the first voltage. For example, in a case where the second clock signal is at an effective level, the fifth transistor T5 is turned on, so that the second node PD is connected with the second clock signal terminal CKB, thereby charging the second node PD to a high level; and in a case where the control node PUCN is at an effective level, the sixth transistor T6 is turned on, so that the second node PD is connected with the first voltage terminal VGL, thereby pulling down the second node PD to a low level.

For example, by controlling the timing of the first input signal of the first input terminal INPUT1, the second input signal of the second input terminal INPUT2, and the second clock signal of the second clock signal terminal CKB, the second clock signal of the second clock signal terminal CKB and the first voltage of the first voltage terminal VGL can control the second node PD time-divisionally. For example, in the input phase, the second clock terminal CKB provides a high level, so that the fifth transistor T5 is turned on, thereby inputting the high level of the second clock signal to the second node PD, and storing the high level in the second capacitor C2. In the pre-charging phase, the second clock terminal CKB provides a low level, the sixth transistor T6 is turned on under control of the high level of the control node PUCN, thereby connecting the second node PD and the first voltage terminal VGL, and pulling down the level of the second node PD. For example, the fifth transistor T5 and the sixth transistor T6 are time-divisionally turned on in the input phase and the pre-charging phase, thereby the fifth transistor T5 and the sixth transistor T6 can be avoiding from being simultaneously turned on to cause a DC path from the second clock signal terminal CKB to the first voltage terminal VGL, so that the power consumption of the gate drive circuit including a plurality of cascaded shift register units can be reduced, and the stability of the circuit structure can be improved.

The pull-down sub-circuit 50 includes a seventh transistor T7 and an eighth transistor T8. A gate electrode of the seventh transistor T7 is connected with the second node PD, a first electrode of the seventh transistor T7 is connected with the first node PU, and a second electrode of the seventh transistor T7 is connected with the first voltage terminal VGL to receive the first voltage. A gate electrode of the eighth transistor T8 is connected with the second node PD, a first electrode of the eighth transistor T8 is connected with the output terminal OUT, and a second electrode of the eighth transistor T8 is connected with the first voltage terminal VGL to receive the first voltage.

It should be noted that in the descriptions of respective embodiments of the present disclosure, the first node PU, the second node PD, and the control node PUCN are not meant to represent actual components, but rather represent meeting points of related electrical connections in the circuit schematic diagram.

It should be noted that the transistors in the embodiments of the present disclosure can adopt thin film transistors, field-effect transistors or other switching devices with the required characteristics. In the embodiments of the present disclosure, thin film transistors are adopted as an example for description. Source electrodes and drain electrodes of the transistors adopted herein can be symmetrical in structure, so that the source electrodes and drain electrodes are not different in structure. In the embodiment of the present disclosure, in order to distinguish between the two electrodes of a transistor other than a gate electrode, it is directly described that one of the two electrodes is a first electrode and the other electrode is a second electrode.

Figure 3:
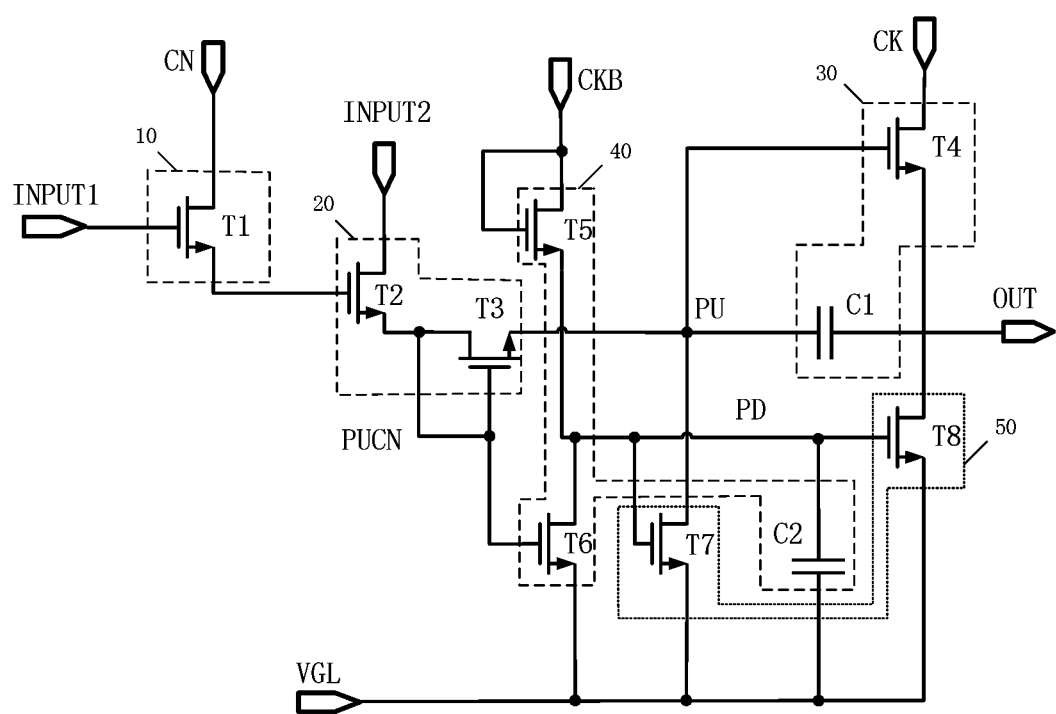
FIG. 3 is a circuit structure schematic diagram of the shift register unit as shown in FIG. 2.

It should be noted that the embodiments of the present disclosure do not limit an (n)th (n is an integer greater than or equal to 1) transistor as one transistor, which can be a series connection of a plurality of transistors, and an example in which the (n)th transistor includes one transistor is illustrated in FIG. 3. In the embodiments of the present disclosure, the transistors can all be P-type transistors or N-type transistors. In a case where the transistors are all P-type transistors, the first electrode is the source electrode, and the second electrode is the drain electrode. In a case where the transistors are all N-type transistors, the first electrode is the drain electrode, and the second electrode is the source electrode. The embodiments of the present disclosure are described by taking a case that each transistor is an N-type transistor as an example, and the first voltage terminal VGL outputs a constant low level.

In the embodiments of the present disclosure, for example, in a case where each circuit is implemented to include N-type transistors, the term "pull-up" means charging a node or an electrode of a transistor such that an absolute value of a level of the node or the electrode is increased to achieve an operation of the corresponding transistor (e.g., turning on the transistor); and the term "pull-down" means discharging a node or an electrode of a transistor such that an absolute value of a level of the node or the electrode is reduced to achieve an operation of the corresponding transistor (e.g., turning off the transistor). For another example, in a case where each circuit is implemented to include P-type transistors, the term "pull-up" means discharging a node or an electrode of a transistor such that an absolute value of a level of the node or the electrode is reduced to achieve an operation of the corresponding transistor (e.g., turning on the transistor); and the term "pull-down" means charging a node or an electrode of a transistor such that an absolute value of a level of the node or the electrode is raised to achieve an operation of the corresponding transistor (e.g., turning off the transistor).

An operation principle of the shift register unit as shown in FIG. 3 is described below in combination with FIG. 4, and in a frame of an image, the operation of the shift register unit includes an input phase P1, a pre-charging phase P2, an output phase P3, and a reset phase P4.

In the input phase P1, the first input terminal INPUT1 provides a high level (that is, the first input signal is at a high level), the second clock signal terminal CKB provides a high level (that is, the second clock signal is at a high level), and the first input sub-circuit 10 outputs a signal of the first control signal terminal CN to the pull-up control sub-circuit 20 under control of the high level of the first input INPUT1. Under control of high level of the second clock signal terminal CKB, the pull-down control sub-circuit 40 outputs a high-level signal of the second clock signal terminal CKB to the second node PD to charge the second node PD. The pull-down sub-circuit 50 outputs the first voltage of the first voltage terminal VGL to the first node PU under control of the level of the second node PD, in order to avoid the first node PU from being to be charged in this stage.

Specifically, INPUT1=1, INPUT2=0, CN=1, CKB=1, CK=0, PUCN=0, PU=0, PD=1, and OUT=0. Where, "1" represents a high level and "0" represents a low level.

In this case, the first transistor T1 is turned on under control of the high level of the first input terminal INPUT1, the first control signal of the first control signal terminal CN is output to the gate electrode of the second transistor T2 through the first transistor T1, the second transistor T2 is turned on, the low level of the second input terminal INPUT2 is output to the control node PUCN through the second transistor T2, the third transistor T3 and the sixth transistor T6 are in a turned-off state under control of the control node PUCN. The fifth transistor T5 is turned on under control of the second clock signal of the second clock signal terminal CKB, the second clock signal provided by the second clock signal terminal CKB charges the second node PD through the fifth transistor T5, thereby the second node PD is at a high level. Meanwhile, the seventh transistor T7 and the eighth transistor T8 are turned on under control of the level of the second node PD, and the first voltage of the first voltage terminal VGL is respectively outputted to the output terminal OUT and the node PU through the seventh transistor T7 and the eighth transistor T8. The fourth transistor T4 is in a turn-off state under control of the first node PU, so that in this stage, the output terminal OUT outputs a low level.

In summary, in the input phase, the fifth transistor T5 is turned on, and the sixth transistor T6 is turned off, thereby avoiding the fifth transistor T5 and the sixth transistor T6 from being simultaneously turned on to cause a DC path (that is, a short path) from the second clock signal terminal CKB to the first voltage terminal VGL, and avoiding the problem that the potential of the first node PU and the potential of the second node PD compete with each other caused by the DC path. Therefore, the power consumption of the gate drive circuit including a plurality of cascaded shift register units can be reduced, and the stability of the circuit structure of the gate drive circuit can be improved.

In the pre-charging phase P2, the second input terminal INPUT2 provides a high level, the first clock signal terminal CK provides a low level. For example, the first control signal outputted by the first input sub-circuit 10 can be maintained to the pre-charging phase P2, thereby under control of the first control signal outputted by the first input sub-circuit 10, the pull-up control sub-circuit 20 outputs the high level of the second input terminal INPUT2 (that is, the second input signal) to the first node the PU to charge the first node PU to a first high level. The pull-up control sub-circuit 20 further outputs the high level of the second input terminal INPUT2 to the pull-down control sub-circuit 40, and the pull-down control sub-circuit 40 outputs the first voltage of the first voltage terminal VGL to the second node PD under control of the high level of the second input terminal INPUT2, there pulling down the level of the second node PD, and avoiding the charging of the first node PU from being affected by the level of the second node PD.

Specifically, INPUT1=0, INPUT2=1, CN=1, CKB=0, CK=0, PUCN=1, PU=1, PD=0, and OUT=0.

In this case, the first transistor T1 is turned off under control of the high level of the first input terminal INPUT1. The high level of the second input INPUT2 is output to the control node PUCN through the second transistor T2, and the third transistor T3 and the sixth transistor T6 are turned on under control of a level of the control node PUCN. A high level of the control node PUCN is output to the first node PU through the third transistor T3, the fourth transistor T4 is turned on under control of the level of the first node PU, and the low level of the first clock signal terminal CK is output to the output terminal OUT through the fourth transistor T4, so that in this stage, the output terminal OUT outputs a low level. The first voltage of the first voltage terminal VGL is output to the second node PD through the sixth transistor T6, and the seventh transistor T7 and the eighth transistor T8 are turned off under control of the level of the second node PD. The fifth transistor T5 is turned off under control of the low level of the second clock signal terminal CKB.

In summary, in the pre-charging phase, the fifth transistor T5 is turned off, and the sixth transistor T6 is turned on, thereby avoiding the fifth transistor T5 and the sixth transistor T6 from being simultaneously turned on to cause the DC path (that is, a short path) from the second clock signal terminal CKB to the first voltage terminal VGL, and avoiding the problem that the potential of the first node PU and the potential of the second node PD compete with each other caused by the DC path. Therefore, the power consumption of the gate drive circuit including a plurality of cascaded shift register units can be reduced, and the stability of the circuit structure of the gate drive circuit can be improved. Because the first clock signal terminal CK provides a low level, the output terminal OUT does not output a gate line scanning signal during this stage.

In the output phase P3, the first clock signal terminal CK provides a high level, and the output sub-circuit 30 outputs the high level of the first clock signal terminal CK to the output terminal OUT under control of the level of the first node PU.

Specifically, INPUT1=0, INPUT2=0, CN=1, CKB=0, CK=1, PUCN=0, PU=1, PD=0, and OUT=1.

In this case, the low level of the second input INPUT2 is output to the control node PUCN through the second transistor T2, and the third transistor T3 and the sixth transistor T6 are turned off under control of the level of the control node PUCN. The fourth transistor T4 is turned on under control of the level of the first node PU, and the high level of the first clock signal terminal CK is output to the output terminal OUT through the fourth transistor T4. Due to the bootstrap effect of the first capacitor C1, the level of the first node PU is further increased and charged to a second high level. In addition, the states of the first transistor T1, the fifth transistor T5, the seventh transistor T7, and the eighth transistor T8 are the same as the states in the pre-charging phase, and details are not described herein again.

In summary, the output terminal OUT outputs the gate line scanning signal in this stage.

In a reset phase P4, the second clock signal terminal CKB provides a high level, and the pull-down control sub-circuit 40 outputs the high level of the second clock signal terminal CKB to the second node PD under control of the high level of the second clock signal terminal CKB, thereby charging the second node PD to a high level. The pull-down sub-circuit 50 outputs the first voltage of the first voltage terminal VGL to the first node PU and the output terminal OUT under control of the level of the second node PD.

Specifically, INPUT1=0, INPUT2=0, CN=1, CKB=1, CK=0, PUCN=0, PU=0, PD=1, and OUT=0.

In this case, the fifth transistor T5 is turned on under control of the level of the second clock signal terminal CKB, and the high level of the second clock terminal CKB is output to the second node PD through the fifth transistor T5 and the high level is stored in the second capacitor C2, thereby causing the second node PD to be at a high level. The seventh transistor T7 and the eighth transistor T8 are turned on under control of the second node PD, the first voltage of the first voltage terminal VGL is output to the first node PU through the seven transistor T7, and the first voltage of the first voltage terminal VGL is output to the output terminal OUT through the eighth transistor T8, thereby resetting the first node PU and the output terminal OUT. The fourth transistor T4 is turned off under control of the level of the first node PU. In addition, the first transistor T1, the second transistor T2, and the third transistor T3 are in a turn-off state.

On this basis, before starting a next frame of an image, when CKB=0, the fifth transistor T5 is turned off, and under the action of the second capacitor C2, the second node PD continues at a high level, so that the level of the first node PU and the level of the output terminal OUT continue at a low level under control of the level of the second node PD, thereby ensuring the normal output of the shift register unit.

As described above, because the fifth transistor T5 and the sixth transistor T6 are turned on time-divisionally during operation process of the shift register unit provided by the embodiment of the present disclosure, thereby avoiding the fifth transistor T5 and the sixth transistor T6 from being simultaneously turned on to cause the DC path from the second clock signal terminal CKB to the first voltage terminal VGL, and avoiding the problem that the potential of the first node PU and the potential of the second node PD compete with each other caused by the DC path, so that the charging efficiency of the second node PD is higher and the level of the first node PU is more stable, thereby improving the stability of the shift register unit.

Figure 5:
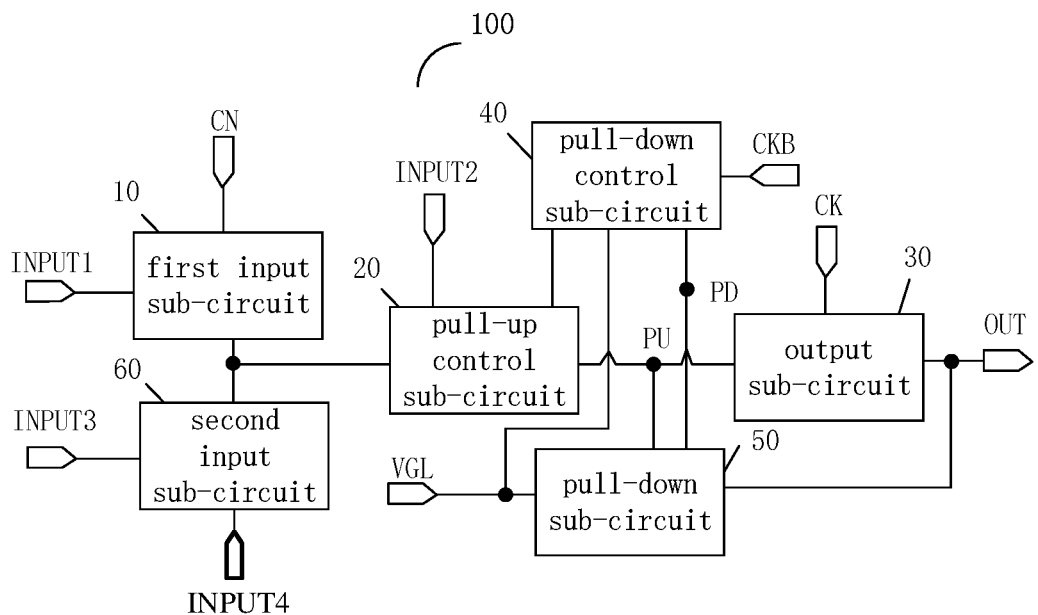
FIG. 5 is a block schematic diagram of the shift register unit as shown in FIG. 2 including a second input sub-circuit.

On the basis of this case (on the basis of the example as shown in FIG. 2), for example, as shown in FIG. 5, the shift register unit provided by the embodiment of the present disclosure can further include a second input sub-circuit 60. The second input sub-circuit 60 is connected with a third input terminal INPUT3, a fourth input terminal INPUT4, a second control signal terminal CNB and a control node PUCN, and the second input sub-circuit 60 is configured to output a fourth input signal of the fourth input terminal INPUT4 to the control node PUCN under control of a third input signal of the third input terminal INPUT3 and a second control signal of the second control signal terminal CNB.

For example, as shown in FIG. 6, the second input sub-circuit 60 includes a ninth transistor T9 and a tenth transistor T10, a gate electrode of the ninth transistor T9 is connected with the third input terminal INPUT3 to receive the third input signal, a first electrode of the ninth transistor T9 is connected with the second control signal terminal CNB to receive the second control signal, and a second electrode of the ninth transistor T9 is connected with a gate electrode of the tenth transistor T10. A first electrode of the tenth transistor T10 is connected with the fourth input terminal INPUT4 to receive the fourth input signal, and a second electrode of the tenth transistor T10 is connected with the control node PUCN.

In this case, a gate drive circuit formed by a plurality of cascaded shift register units can achieve a forward scanning and a backward scanning, particularly, the first control signal and the second control signal are used as control signals of the forward scanning and the backward scanning Taking the ninth transistor T9 as an N-type transistor as an example, when CN=0, and CNB=1 (that is, the first control signal is at a low level, and the second control signal is at a high level), the gate drive circuit can be used for the backward scanning; and when CN=1, CNB=0 (that is, the first control signal is at a high level, and the second control signal is at a low level), the gate drive circuit can be used for the forward scanning.

In a case where the shift register unit as shown in FIG. 6 is used for the forward scanning, the second input sub-circuit 20 does not work during the input phase, and the operation process of the other sub-circuits is the same as the foregoing, and details are not described herein again. In a case where the shift register unit as shown in FIG. 6 is used for the backward scanning, in the input phase, the first input sub-circuit 10 does not work, and the second input sub-circuit 20 does work, that is, the ninth transistor T9 and the tenth transistor T10 are turned on under control of the third input signal of the third input terminal INPUT3 and the fourth input signal of the fourth input terminal INPUT4, and the second control signal terminal CNB is connected with the gate electrode of the tenth transistor T10, so that the second control signal of the second control signal terminal CNB is output to gate electrode of the tenth transistor T10 through the ninth transistor T9, thereby controlling the tenth transistor T10 to be turned on, and inputting the fourth input signal inputted by the fourth input terminal INPUT4 to the control node PUCN, thereby controlling the third transistor T3 to be turned on. The operation process of the other sub-circuits is the same as the foregoing, and details are not described herein again.

Figure 4:
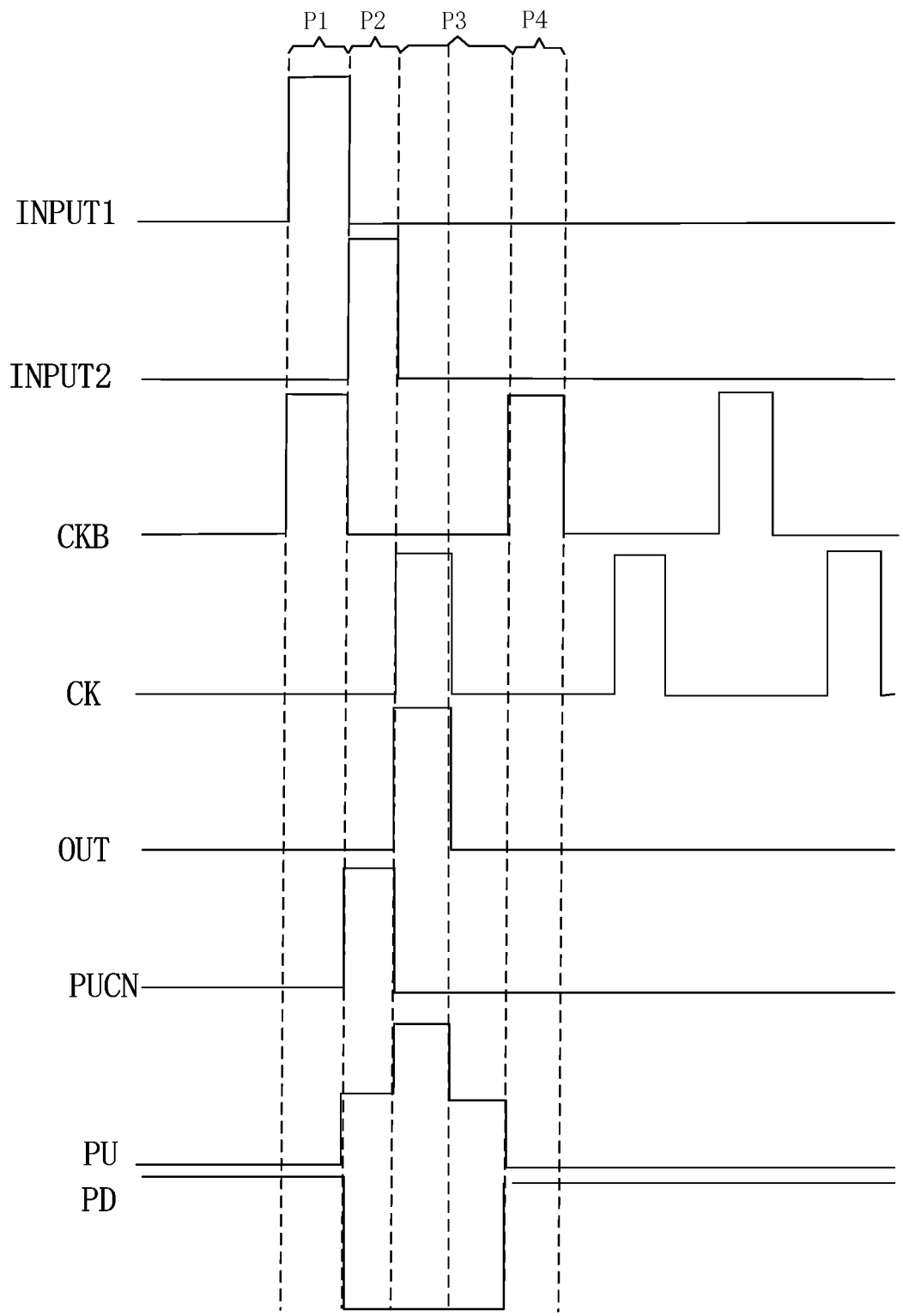
FIG. 4 is a timing control schematic diagram of the shift register unit as shown in FIG. 3.

It should be noted that, the embodiments of the present disclosure are described by a case that each transistor is an N-type transistor as an example, and those skilled in the art can understand that in a case where each transistor is a P-type transistor, it is only necessary to reverse the timing signals in FIG. 4, which will not be described in this embodiment.

The embodiment of the present disclosure provides a control method of the shift register unit as described in the foregoing embodiment. As shown in FIG. 4, the control method includes an input phase P1, a pre-charging phase P2, an output phase P3, and a reset phase P4.

In the input phase P1, the first input terminal INPUT1 provides a high level (that is, the first input signal is at a high level), the second clock signal terminal CKB provides a high level, and the first input sub-circuit 10 outputs a high-level signal of the first control signal terminal CN to the pull-up control sub-circuit 20 under control of the high level of the first input terminal INPUT1. The pull-down control sub-circuit 40 outputs the high-level signal of the second clock signal terminal CKB to the second node PD under control of the high level of the second clock signal terminal CKB. The pull-down sub-circuit 50 outputs the first voltage of the first voltage terminal VGL to the first node PU under control of the level of the second node PD.

In the pre-charging phase P2, the second input terminal INPUT2 provides a high level, the first clock signal terminal CK provides a low level, for example, the first control signal of the first input sub-circuit 10 can be maintained to the pre-charging phase P2, so that the pull-up control sub-circuit 20 outputs the high-level signal of the second input terminal INPUT2 to the first node PU under control of the first control signal output by the first input sub-circuit 10. The pull-up control sub-circuit 20 further outputs the high-level signal of the second input terminal INPUT2 to the pull-down control sub-circuit 40, and the pull-down control sub-circuit 40 outputs the first voltage of the first voltage terminal VGL to the second node PD under control of the high-level signal of the second input terminal INPUT2.

In the output phase P3, the first clock signal terminal CK provides a high level, and the output sub-circuit 30 outputs the high-level signal of the first clock signal terminal CK to the output terminal OUT under control of the level of the first node PU.

In the reset phase P4, the second clock signal terminal CKB provides a high level, and the pull-down control sub-circuit 40 outputs the high-level signal of the second clock signal terminal CKB to the second node PD under control of the high level of the second clock signal terminal CKB. The pull-down control sub-circuit 40 outputs the first voltage of the first voltage terminal VGL to the first node PU and the output terminal OUT under control of the level of the second node PD.

It should be noted that the foregoing describes the working processes of the foregoing stages in detail, and details are not described herein again.

Based on this case, in the control method of the shift register unit provided by the embodiment of the present disclosure, in the input phase, the first input sub-circuit 10 outputs the first control signal of the first control signal terminal CN to the pull-up control sub-circuit 20 under control of the first input signal of the first input terminal INPUT1. The pull-down control sub-circuit 40 outputs the second clock signal of the second clock signal terminal CKB to the second node PD under control of the second clock signal of the second clock signal terminal CKB. The pull-down sub-circuit 50 outputs the first voltage of the first voltage terminal to the first node PU under control of the level of the second node PD.

In the pre-charging phase, the pull-up control sub-circuit 20 outputs the second input signal of the second input terminal INPUT2 to the first node PU under control of the first control signal output by the first input sub-circuit 10. The pull-up control sub-circuit 20 further outputs the second input signal of the second input terminal INPUT2 to the pull-down control sub-circuit 40, and the pull-down control sub-circuit 40 outputs the first voltage of the first voltage terminal VGL to the second node PD under control of the second input signal of the second input terminal INPUT2, thereby pulling down the level of the second node PD to ensure that the first node PU is charged normally during this stage.

In summary, in the input phase and the pre-charging phase, the problem that the potential of the first node PU and the potential of the second node PD compete with each other to increase the power consumption of the circuit is avoided, and a DC path from the second clock signal terminal CKB to the first voltage terminal VGL caused by the fifth transistor T5 and the sixth transistor T6 simultaneously turned on is avoid, thereby improving the stability of the shift register unit.

At least one embodiment of the present disclosure provides a shift register unit, as shown in FIG. 3, in an example, the shift register unit includes a first transistor T1, a second transistor T2, a third transistor T3 to a sixth transistor T6, a first capacitor C1 and a second capacitor C2.

A gate electrode of the first transistor T1 is connected with a first input terminal INPUT1 to receive a first input signal, a first electrode of the first transistor T1 is connected with a first control signal terminal CN to receive a first control signal, and a second electrode of the first transistor T1 is connected with a gate electrode of the second transistor T2. A first electrode of the second transistor T2 is connected with a second input terminal INPUT2 to receive a second input signal, a second electrode of the second transistor T2 is connected with a gate electrode of the third transistor T3, a first electrode of the third transistor T3 and a gate electrode of the sixth transistor T6, and a second electrode of the third transistor T3 is connected with a first node PU.

A gate electrode of a fourth transistor T4 is connected with the first node PU, a first electrode of the fourth transistor T4 is connected with a first clock signal terminal CK to receive a first clock signal, and a second electrode of the fourth transistor T4 is connected with the output terminal OUT. A first terminal of the first capacitor C1 is connected with the first node PU, and a second terminal of the first capacitor C1 is connected with the output terminal OUT.

A gate electrode of a fifth transistor T5 and a first electrode of the fifth transistor T5 are connected with a second clock signal CKB to receive a second clock signal, and a second electrode of the fifth transistor T5 is connected with the second node PD. A first electrode of the sixth transistor T6 is connected with a second node PD, and a second electrode of the sixth transistor T6 is connected with a first voltage terminal VGL to receive a first voltage. A first terminal of the second capacitor C2 is connected with the second node PD, and a second terminal of the second capacitor C2 is connected with the first voltage terminal VGL to receive the first Voltage.

For example, as shown in FIG. 3, in another example, the shift register unit further includes a seventh transistor T7 and an eighth transistor T8.

A gate electrode of the seventh transistor T7 is connected with the second node PD, a first electrode of the seventh transistor T7 is connected with the first node PU, and a second electrode of the seventh transistor T7 is connected with the first voltage terminal VGL to receive the first voltage. A gate electrode of the eighth transistor T8 is connected with the second node PD, a first electrode of the eighth transistor T8 is connected with the output terminal OUT, and a second electrode of the eighth transistor T8 is connected with the first voltage terminal VGL to receive the first voltage.

It should be noted that the foregoing embodiment has already explained the working process and beneficial effects of the shift register unit as shown in FIG. 3 in detail, and details are not described herein again.

On this basis, for example, as shown in FIG. 6, on the example as shown in FIG. 3, the shift register unit further includes a ninth transistor T9 and a tenth transistor T10. A gate electrode of the ninth transistor T9 is connected with a third input terminal INPUT3 to receive a third input signal, a first electrode of the ninth transistor T9 is connected with a second control signal terminal CNB to receive a second control signal, and a second electrode of the ninth transistor T9 is connected with the second electrode of the first transistor T1, the gate electrode of the second transistor T2 and a gate electrode of the tenth transistor T10. A first electrode of the tenth transistor T10 is connected with a fourth input terminal INPUT4 to receive a fourth input signal, and a second electrode of the tenth transistor T10 is connected with the gate electrode of the third transistor T3, the first electrode of the third transistor T3 and the gate electrode of the sixth transistor T6.

For example, the above-described respective transistor (the first transistor T1 to the tenth transistor T10) can be all N-type transistor or P-type transistor, the embodiments of the present disclosure are not limited to this.

In this case, the gate drive circuit formed by a plurality of cascaded shift register units can realize the forward scanning and the backward scanning, and the foregoing embodiments have described the working process and beneficial effects of the shift register unit as shown in FIG. 6, and detailed description will not be repeated here.

Figure 7:
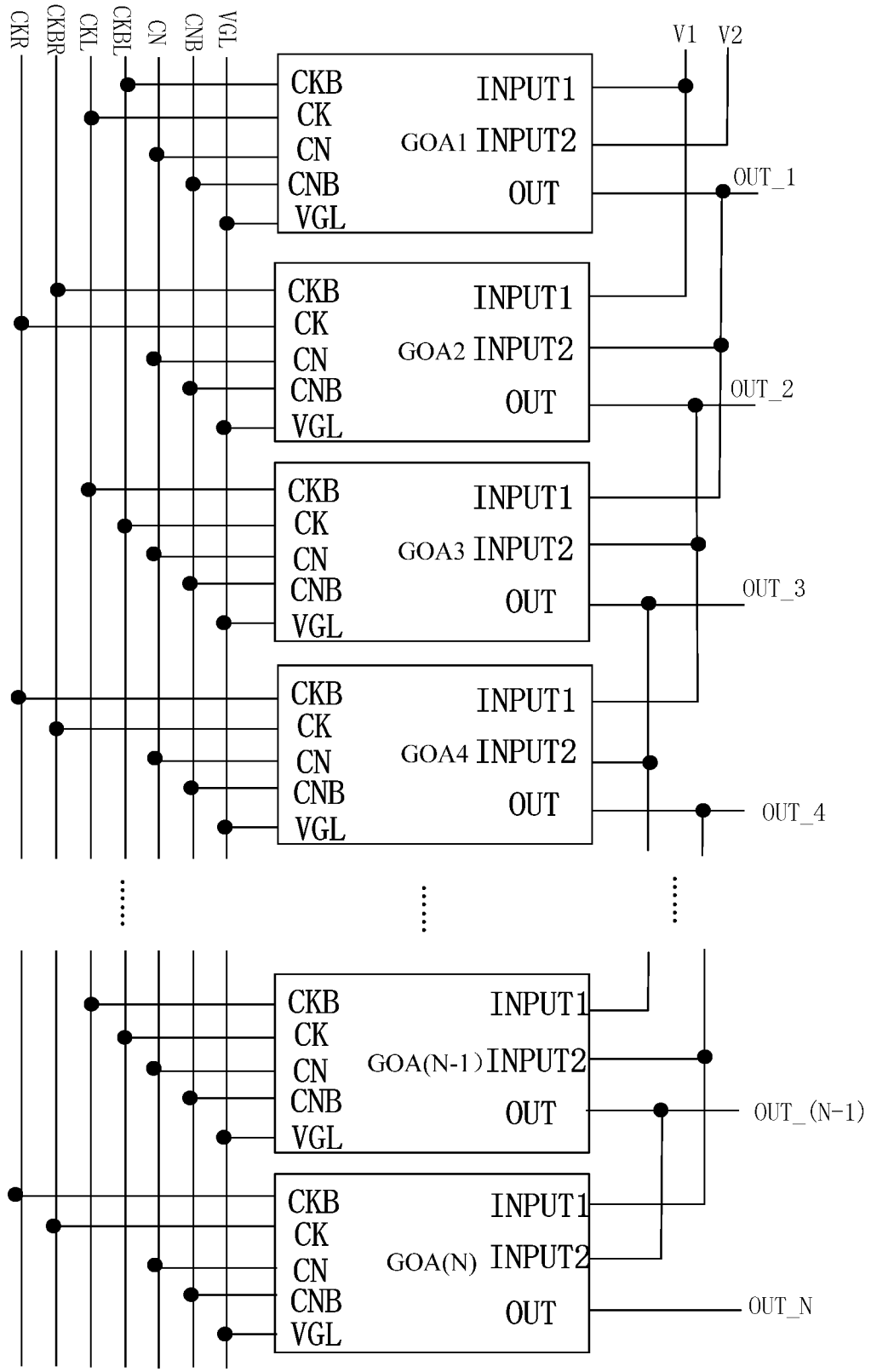
FIG. 7 is a structure schematic diagram of a gate drive circuit including a plurality of cascaded shift register units as shown in FIG. 3.
Figure 8:
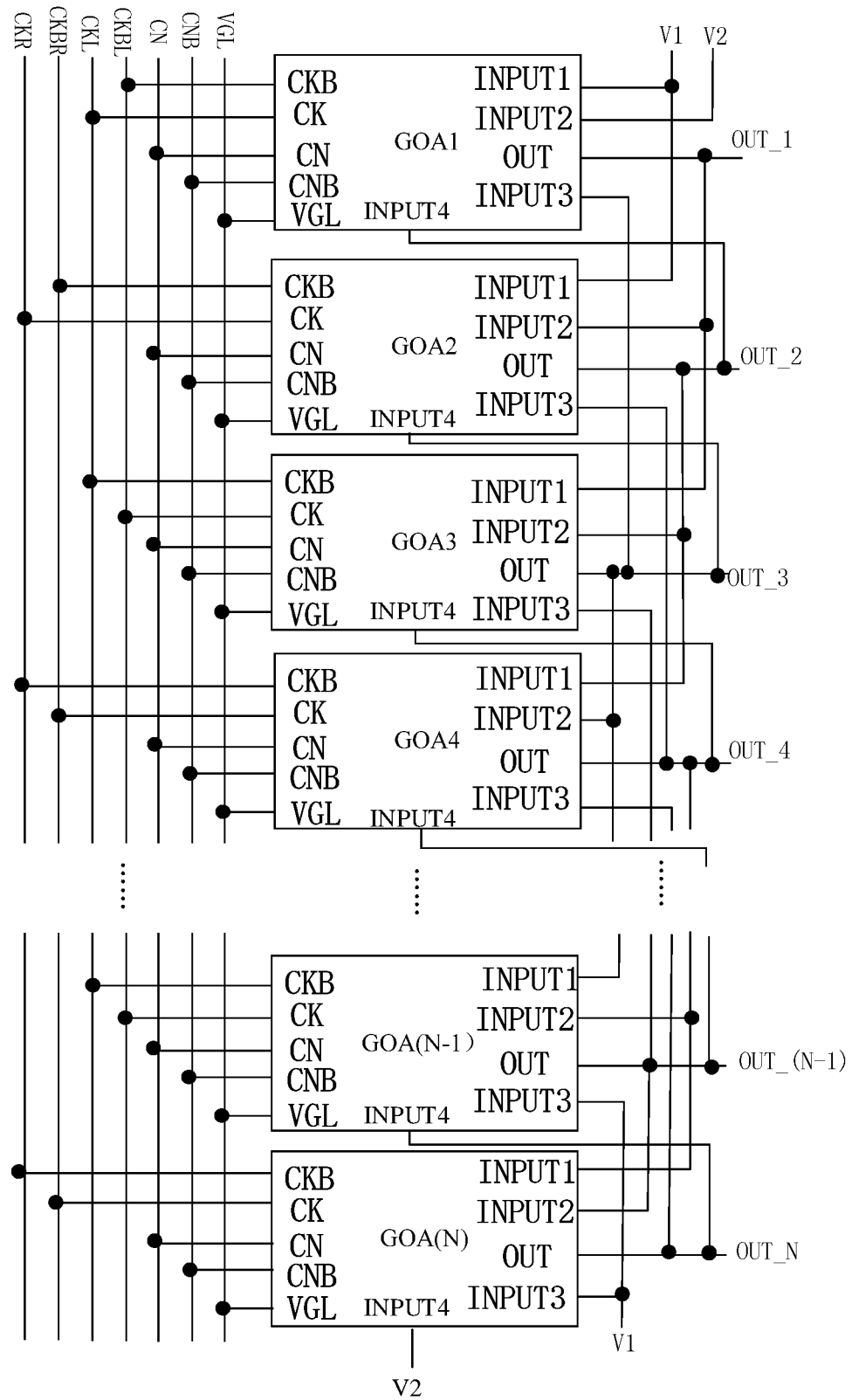
FIG. 8 is a structure schematic diagram of a gate drive circuit including a plurality of cascaded shift register units as shown in FIG. 6.

At least one embodiment of the present disclosure further provides a gate drive circuit includes a plurality of cascaded shift register units as described in the foregoing embodiments. For example, the gate drive circuit as shown in FIG. 7 is described by taking a case that each shift register unit uses a circuit structure as shown in FIG. 3 as an example, and the gate drive circuit as shown in FIG. 8 is described by taking a case that each shift register unit uses a circuit structure as shown in FIG. 6 as an example, but the embodiments of the present disclosure are not limited thereto. The gate drive circuit can be directly fabricated on a substrate of a display device by adopting the processes similar to those for forming a thin film transistor, and can realize a function of performing display line by line.

As shown in FIG. 7, a first input terminal INPUT1 of a first-stage of the shift register units and a first input terminal INPUT1 of a second-stage of the shift register units are connected with a first signal terminal V1 to receive a trigger signal. Except the first-stage of the shift register units and the second-stage of the shift register units, a first input terminal INPUT1 of an (N)th-stage (N is an integer greater than or equal to 3) of the shift register units is connected with an output terminal OUT_(N−2) of an (N−2)th-stage of the shift register units.

A second input terminal INPUT2 of the first-stage of the shift register units is connected with a second signal terminal V2, and except the first-stage of the shift register units, a second input terminal INPUT2 of the (N)th-stage of the shift register units is connected with an output terminal OUT_(N−1) of an (N−1)th-stage of the shift register units.

The shift register unit of the gate drive circuit provided by the embodiment of the present disclosure has the same structure and advantageous effects as the shift register unit provided by the foregoing embodiment, and because the foregoing has been described in detail for its structure and advantageous effects, it will not be described again here.

Based on this, in a case where the shift register unit includes the second input sub-circuit 60, or includes the ninth transistor T9 and the tenth transistor T10, as shown in FIG. 8, except last two stages of the shift register units, a third input terminal INPUT3 of the (N)th-stage of the shift register units is connected with an output terminal OUT_(N+2) of an (N+2)th-stage of the shift register units. A fourth input terminal INPUT4 of the last-stage of the shift register units is connected with the second signal terminal V2. Except a last-stage of the shift register units, a fourth input terminal INPUT4 of the (N)th-stage of the shift register units is connected with an output terminal OUT_(N+1) of an (N+1)th-stage of the shift register units. Two third input terminals INPUT3 of the last two stages of the shift register units are connected with the first signal terminal V1. In this case, the gate drive circuit can be used for the forward scanning and the backward scanning.

For example, as shown in FIG. 7 or FIG. 8, OUT_1, OUT_2, OUT_3, and OUT_4 respectively represent an output terminal of the first-stage, a second-stage, a third-stage and a fourth-stage of the shift register units of the gate drive circuit 20. Similarly, OUT_(N−1) and OUT_(N) respectively represent an output terminal of the (N−1)th-stage and the (N)th-stage of the shift register units, and so on . . . .

As shown in FIG. 7 or FIG. 8, the gate drive circuit further includes a first clock signal line CKL, a second clock signal line CKBL, a third clock signal lines CKR and a fourth clock signal line CKBR.

For example, as shown in FIG. 7 or FIG. 8, the shift register unit further includes a first clock signal terminal CK, and the first clock signal terminal CK is configured to be connected with the first clock signal line CKL or the third clock signal line CKR to receive the first clock signal. For example, the first clock signal line CKL is connected with an first clock signal terminal CK of a (2m−1)th-stage (m is an integer greater than 0) of the shift register units, and the third clock signal line CKR is connected with a first clock signal terminal CK of a (2m)th-stage of the shift register units. It should be noted that the embodiments of the present disclosure include, but are not limited to, the foregoing connection manner. For example, another connection manner can be adopted, the first clock signal line CKL is connected with the first clock signal terminal CK of a (2m)th-stage of the shift register units, and the third clock signal line CKR is connected with the first clock signal terminal CK of the (2m−1)th-stage of the shift register units.

For example, the shift register unit further includes a second clock signal terminal CKB, and the second clock signal terminal CKB is configured to be respectively connected with the second clock signal line CKBL or the fourth clock signal line CKBR to receive the second clock signal. The specific connection manner is similar to the connection manner between the first clock signal terminal CK and the first clock signal line CKL and the third clock signal line CKR, and details are not described herein again.

For example, the gate drive circuit further includes a first control signal line CN and a second control signal line CNB, and the first control signal line CN and the second control signal line CNB respectively provide a first control signal and a second control signal. For example, the shift register unit further includes a first control signal terminal CN and a second control signal terminal CNB, and the first control signal terminal CN and the second control signal terminal CNB are configured to be respectively connected with the first control signal line CN and the second control signal line CNB to respectively receive the first control signal and the second control signal.

It should to be noted that, as shown in FIG. 7 or FIG. 8, CN can represent the first control signal terminal and can represent the first control signal line (providing the first control signal), and CNB can represent the second control signal terminal and can represent the second control signal line (providing the second control signal).

For example, the gate drive circuit further includes a first voltage line VGL to provide the first voltage. For example, each stage of the shift register units further includes a first voltage terminal VGL, and the first voltage terminal VGL is configured to be connected with the first voltage line VGL to receive the first voltage. It should be noted that, as shown in FIG. 7 or FIG. 8, VGL can represent the first voltage terminal and can represent the first voltage line (providing the first voltage).

For example, the gate drive circuit can further include a timing controller (not shown in FIG. 7 or 8). For example, the timing controller can be configured to be connected with the first clock signal line CKL, the second clock signal line CKBL, the third clock signal line CKR, the fourth clock signal line CKBR, the first control signal line CN, the second control signal line CNB and the first voltage line VGL and the like, to provide clock signals, control signals and the first voltage to the shift register units. For example, the timing controller can further be configured to provide the trigger signal STV and a reset signal RESET.

It should be noted that, in a case where a display panel is driven by the gate drive circuit as shown in FIG. 7 or FIG. 8, the gate drive circuit can be disposed on one side of the display panel. For example, the display panel includes a plurality of rows of gate lines, and the output terminals of the shift register units in the gate drive circuit can be configured to be sequentially connected with the plurality of rows of gate lines for outputting the gate scanning signals.

For example, the gate drive circuit as shown in FIG. 7 or 8 can further be used to alternately drive the gate lines bilaterally. As an example, the even-stages of the shift register units are disposed on one side of the display panel for driving even-numbered rows of gate lines, and the odd-stages of the shift register units are disposed on the other side of the display panel for driving odd-numbered rows of gate lines.

Figure 9:
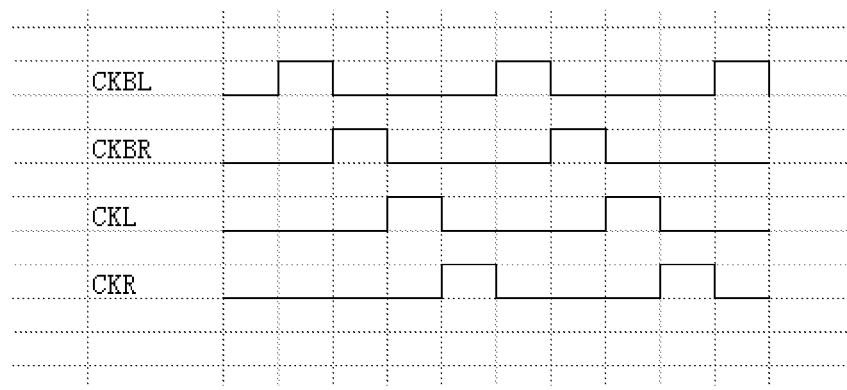
FIG. 9 is a timing schematic diagram of a gate drive circuit as shown in FIG. 7 or FIG. 8.

In this case, referring to FIG. 7 and FIG. 8, the clock signals in the gate drive circuit provided by the embodiment of the present disclosure can be cycled in a form of CKBL, CKBR, CKL and CKR, that is, the clock signals provided to each adjacent four-stage shift register units are a period, particularly as shown in FIG. 9, the duty cycles of CKBL, CKBR, CKL and CKR are all 25%, and only one of the clock signals CKBL, CKBR, CKL and CKR is at a high level at a same time.

It should be noted that, according to different configurations, the gate drive circuit can further include six or eight clock signal lines and the like, the number of clock signal lines is determined by a specifically situation, and the embodiment of the present disclosure is not limited to this case.

At least one embodiment of the present disclosure further provides a display device, including the gate drive circuit as shown in FIG. 7 or FIG. 8. The display device has the advantageous effects as the gate drive circuit provided by the foregoing embodiment. Because the foregoing embodiment has been described in detail for the advantageous effects of the gate drive circuit, details are not described herein again.

Figure 10:
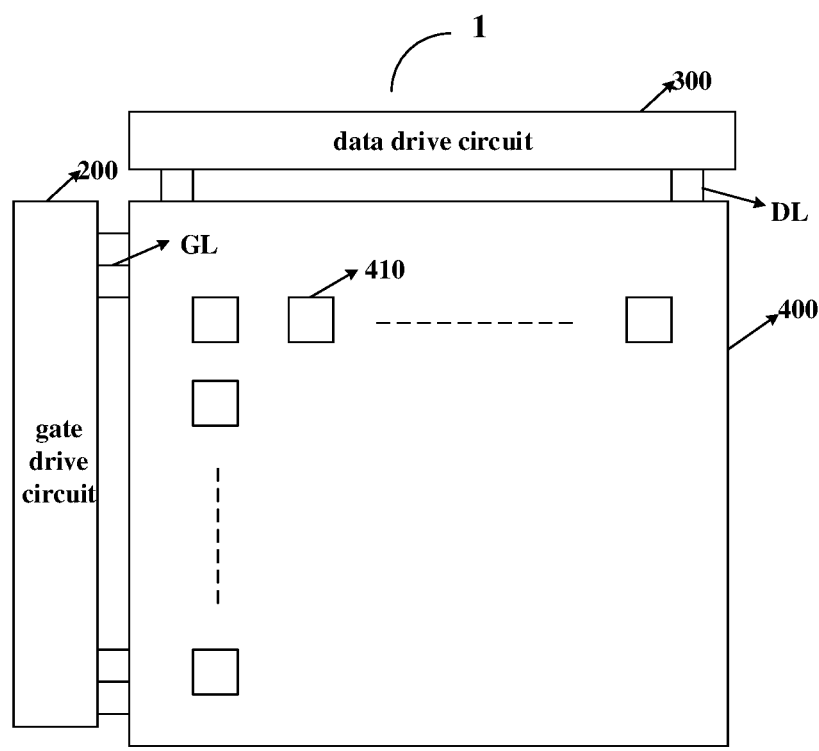
FIG. 10 is a schematic diagram of a display device provided by at least one embodiment of the present disclosure.

As shown in FIG. 10, the display device 1 includes the gate drive circuit 200 provided by the embodiment of the present disclosure. The display device 1 further includes a display panel 400, and the display panel 400 includes a pixel array including a plurality of sub-pixel units 410. For example, the display device 1 can further include a data drive circuit 300. The data drive circuit 300 is used for providing data signals to the pixel array. The gate drive circuit 200 is used for providing driving signals to the pixel array, and for example, the driving signals can drive scanning transistors and sensing transistors of the sub-pixel unit 410. The data drive circuit 300 is electrically connected with the sub-pixel units 410 through data lines DL, and the gate drive circuit 200 is electrically connected with the sub-pixel units 410 through gate lines GL.

It should be noted that the display device can include at least a liquid crystal display device and an organic light emitting diode display device. For example, the display device can be any product or component having a display function, such as a liquid crystal display, a liquid crystal television, a digital photo frame, a mobile phone, or a tablet computer and the like.

At least one embodiment of the present disclosure further provides a driving method of the shift register unit, and the driving method can be used to drive the shift register unit 100 provided by the embodiment of the present disclosure, for example, in an example, the driving method includes the following operations.

In an input phase, the first input sub-circuit 10 outputs the first control signal of the first control signal terminal CN to the pull-up control sub-circuit 20 under control of the first input signal of the first input terminal INPUT1, and the pull-down control sub-circuit 40 outputs the second clock signal of the second clock signal terminal CKB to the second node PD under control of the second clock signal of the second clock signal terminal CKB.

In a pre-charging phase, the pull-up control sub-circuit 20 outputs the second input signal of the second input terminal INPUT2 to the first node PU under control of the first control signal output by the first input sub-circuit 10, the pull-up control sub-circuit 20 further outputs the second input signal of the second input terminal INPUT2 to the pull-down control sub-circuit 40, and the pull-down control sub-circuit 40 outputs the first voltage of the first voltage terminal VGL to the second node PD under control of the second input signal of the second input terminal INPUT2.

In an output phase, the output sub-circuit 30 outputs the output signal to the output terminal OUT under control of the level of the first node PU.

For example, in another example, the shift register unit further includes a pull-down sub-circuit 50, and the driving method further includes a reset phase.

For example, in the input phase, the pull-down sub-circuit 50 outputs the first voltage of the first voltage terminal VGL to the first node PU and the output terminal OUT under control of the level of the second node PD.

In the reset phase, the pull-down control sub-circuit 40 outputs the second clock signal to the second node PD under control of the second clock signal of the second clock signal terminal CKB, and the pull-down sub-circuit 50 outputs the first voltage of the first voltage terminal VGL to the first node PU and the output terminal OUT under control of the level of the second nod PD.

For example, in another example, in a case where the backward scanning is adopted, the driving method further includes the following operations.

In the input phase, the second input sub-circuit 60 outputs the second control signal of the second control signal terminal CNB under control of the third input signal of the third input terminal INPUT3, and the pull-down control sub-circuit 40 outputs the second clock signal of the second clock signal terminal CKB to the second node PD under control of the second clock signal of the second clock signal terminal CKB.

In the pre-charging phase, the first input sub-circuit 10 outputs the fourth input signal of the fourth input terminal INPUT4 to the control node PUCN under control of the first control signal, the pull-up control sub-circuit 20 outputs the fourth input signal of the fourth input terminal INPUT4 to the first node PU under control of the level of the control node PUCN, the pull-up control sub-circuit 20 further outputs the fourth input signal of the fourth input terminal INPUT4 to the pull-down control sub-circuit 40, and the pull-down control sub-circuit 40 outputs the first voltage of the first voltage terminal VGL to the second node PD under control of the fourth input signal of the fourth input terminal INPUT4.

In the output phase, the output sub-circuit 30 outputs the output signal to the output terminal OUT under control of the level of the first node PU.

It should be noted that, detailed descriptions and technical effects of the driving method can refer to the descriptions of the working principle of the shift register unit 100 in the embodiment of the present disclosure, and details are not described herein again.

What have been described above are only specific implementations of the present disclosure, the protection scope of the present disclosure is not limited thereto. The protection scope of the present disclosure should be based on the protection scope of the claims.

What is claimed is:

1. A shift register unit, comprising a first input sub-circuit, a first control sub-circuit, an output sub-circuit, and a second control sub-circuit,
   wherein the first input sub-circuit is connected with a first input terminal, a first control signal terminal and the first control sub-circuit, and the first input sub-circuit is configured to output a first control signal of the first control signal terminal to the first control sub-circuit under control of a first input signal of the first input terminal;
   the first control sub-circuit is connected with a second input terminal, a first node and the second control sub-circuit, the first control sub-circuit is configured to output a second input signal of the second input terminal to the first node under control of the first control signal output by the first input sub-circuit, or the first control sub-circuit is configured to output the second input signal to the second control sub-circuit;
   the output sub-circuit is connected with the first node and an output terminal, and the output sub-circuit is configured to output an output signal to the output terminal under control of a level of the first node; and
   the second control sub-circuit is connected with a second clock signal terminal, a second node, a control node and a first voltage terminal, the second control sub-circuit is configured to output a second clock signal to the second node under control of the second clock signal of the second clock signal terminal, or the second control sub-circuit is configured to output a first voltage of the first voltage terminal to the second node under control of a level of the control node;
   wherein the first control sub-circuit comprises a second transistor and a third transistor,
   a gate electrode of the second transistor is connected with an output terminal of the first input sub-circuit, a first electrode of the second transistor is connected with the second input terminal to receive the second input signal, and a second electrode of the second transistor is connected with the control node; and
   a gate electrode of the third transistor is electrically connected with a first electrode of the third transistor, the gate electrode of the third transistor and the first electrode of the third transistor are configured to be connected with the control node respectively, and a second electrode of the third transistor is connected with the first node.

2. The shift register unit according to claim 1, wherein the output sub-circuit comprises a fourth transistor and a first capacitor,
   a gate electrode of the fourth transistor is connected with the first node, a first electrode of the fourth transistor is connected with a first clock signal terminal to receive a first clock signal as the output signal, and a second electrode of the fourth transistor is connected with the output terminal; and
   a first terminal of the first capacitor is connected with the first node, and a second terminal of the first capacitor is connected with the output terminal.

3. The shift register unit according to claim 1, wherein the second control sub-circuit comprises a fifth transistor, a sixth transistor, and a second capacitor,
   a gate electrode of the fifth transistor is connected with a first electrode of the fifth transistor, the gate electrode of the fifth transistor and the first electrode of the fifth transistor are respectively configured to be connected with the second clock signal terminal to receive the second clock signal, and a second electrode of the fifth transistor is connected with the second node;
   a gate electrode of the sixth transistor is connected with the control node, a first electrode of the sixth transistor is connected with the second node, and a second electrode of the sixth transistor is connected with the first voltage terminal to receive the first voltage; and
   a first terminal of the second capacitor is connected with the second node, and a second terminal of the second capacitor is connected with the first voltage terminal to receive the first voltage.

4. The shift register unit according to claim 1, wherein the noise reduction sub-circuit comprises a seventh transistor and an eighth transistor,
   a gate electrode of the seventh transistor is connected with the second node, a first electrode of the seventh transistor is connected with the first node, and a second electrode of the seventh transistor is connected with the first voltage terminal to receive the first voltage; and
   a gate electrode of the eighth transistor is connected with the second node, a first electrode of the eighth transistor is connected with the output terminal, and a second electrode of the eighth transistor is connected with the first voltage terminal to receive the first voltage.

5. The shift register unit according to claim 1, further comprising a second input sub-circuit,
   wherein the second input sub-circuit is connected with a third input terminal, a fourth input terminal, a second control signal terminal, and the control node, and the second input sub-circuit is configured to output a fourth input signal of the fourth input terminal to the control node, under control of a third input signal of the third input terminal and a second control signal of the second control signal terminal.

6. The shift register unit according to claim 5, wherein the second input sub-circuit comprises a ninth transistor and a tenth transistor,
   a gate electrode of the ninth transistor is connected with the third input terminal to receive the third input signal, a first electrode of the ninth transistor is connected with the second control signal terminal to receive the second control signal, and a second electrode of the ninth transistor is connected with a gate electrode of the tenth transistor; and
   a first electrode of the tenth transistor is connected with the fourth input terminal to receive the fourth input signal, and a second electrode of the tenth transistor is connected with the control node.

7. A driving method of the shift register unit according to claim 5, comprising:
in an input phase, via the second input sub-circuit, outputting the second control signal of the second control signal terminal under control of the third input signal of the third input terminal, and via the second control sub-circuit, outputting the second clock signal of the second clock signal terminal to the second node under control of the second clock signal of the second clock signal terminal;
in a pre-charging phase, via the second input sub-circuit outputting the fourth input signal of the fourth input terminal to the control node under control of the second control signal, and via the first control sub-circuit, outputting the fourth input signal of the fourth input terminal to the first node; and via the first control sub-circuit, further outputting the fourth input signal of the fourth input terminal to the second control sub-circuit, and via the second control sub-circuit, outputting the first voltage of the first voltage terminal to the second node under control of the fourth input signal of the fourth input terminal; and
in an output phase, the output sub-circuit outputting the output signal to the output terminal under control of the level of the first node.

8. A gate drive circuit, comprising a plurality of cascaded shift register units, each of which is according to claim 1,
wherein a first input terminal of a first-stage of the shift register units and a first input terminal of a second-stage of the shift register units are connected with a first signal terminal;
except the first-stage of the shift register units and the second-stage of the shift register units, a first input terminal of an (N)th-stage of the shift register units is connected with an output terminal of an (N−2)th-stage of the shift register units;
a second input terminal of the first-stage of the shift register units is connected with a second signal terminal, and except the first-stage of the shift register units, a second input terminal of the (N)th-stage of the shift register units is connected with an output terminal of an (N−1)th-stage of the shift register units; and
N is an integer greater than or equal to 3.

9. The gate drive circuit according to claim 8, wherein in a case where the shift register unit includes a second input sub-circuit, or includes a ninth transistor and a tenth transistor,
except last two stages of the shift register units, a third input terminal of the (N)th-stage of the shift register units is connected with an output terminal of an (N+2)th-stage of the shift register units;
except a last-stage of the shift register units, a fourth input terminal of the (N)th-stage of the shift register units is connected with an output terminal of an (N+1)th-stage of the shift register units; and
third input terminals of the last two stages of the shift register units are connected with the first signal terminal, and a fourth input terminal of the last-stage of the shift register units is connected with the second signal terminal.

10. A display device, comprising the gate drive circuit according to claim 8.

11. The shift register unit according to claim 1, further comprising a noise reduction sub-circuit,
wherein the noise reduction sub-circuit is connected with the second node, the first node, the first voltage terminal and the output terminal, and the noise reduction sub-circuit is configured to output the first voltage of the first voltage terminal to the first node and the output terminal under control of a level of the second node.

12. The shift register unit according to claim 1, wherein the first input sub-circuit comprises a first transistor,
a gate electrode of the first transistor is connected with the first input terminal to receive the first input signal, a first electrode of the first transistor is connected with the first control signal terminal to receive the first control signal, and a second electrode of the first transistor is connected with the first control sub-circuit and is used as an output terminal of the first input sub-circuit.

13. A shift register unit, comprising a first transistor, a second transistor, a third transistor, a fourth transistor, a fifth transistor, a sixth transistor, a ninth transistor, a tenth transistor, a first capacitor, and a second capacitor, wherein
a gate electrode of the first transistor is connected with a first input terminal to receive a first input signal, a first electrode of the first transistor is connected with a first control signal terminal to receive a first control signal, and a second electrode of the first transistor is connected with a gate electrode of the second transistor;
a first electrode of the second transistor is connected with a second input terminal to receive a second input signal, and a second electrode of the second transistor is connected with a gate electrode of the third transistor, a first electrode of the third transistor, and a gate electrode of the sixth transistor;
a second electrode of the third transistor is connected with a first node;
a gate electrode of the fourth transistor is connected with the first node, a first electrode of the fourth transistor is connected with a first clock signal terminal to receive a first clock signal, and a second electrode of the fourth transistor is connected with an output terminal;
a first terminal of the first capacitor is connected with the first node, and a second terminal of the first capacitor is connected with the output terminal;
a gate electrode of the fifth transistor is connected with a first electrode of the fifth transistor, the gate electrode of the fifth transistor is configured to be connected with a second clock signal terminal to receive a second clock signal, and a second electrode of the fifth transistor is connected with a second node;
a first electrode of the sixth transistor is connected with the second node, and a second electrode of the sixth transistor is connected with a first voltage terminal to receive a first voltage; and
a first terminal of the second capacitor is connected with the second node, and a second terminal of the second capacitor is connected with the first voltage terminal to receive the first voltage;
a gate electrode of the ninth transistor is connected with a third input terminal to receive a third input signal, a first electrode of the ninth transistor is connected with a second control signal terminal to receive a second control signal, and a second electrode of the ninth transistor is connected with the second electrode of the first transistor, the gate electrode of the second transistor, and a gate electrode of the tenth transistor; and
a first electrode of the tenth transistor is connected with a fourth input terminal to receive a fourth input signal, and a second electrode of the tenth transistor is connected with the gate electrode of the third transistor, the first electrode of the third transistor, and the gate electrode of the sixth transistor.

14. The shift register unit according to claim 13, wherein the first transistor to the tenth transistor are all N-type transistors or P-type transistors.

15. A gate drive circuit, comprising a plurality of cascaded shift register units, each of which is according to claim 13, wherein a first input terminal of a first-stage of the shift register units and a first input terminal of a second-stage of the shift register units are connected with a first signal terminal;
except the first-stage of the shift register units and the second-stage of the shift register units, a first input terminal of an (N)th-stage of the shift register units is connected with an output terminal of an (N−2)th-stage of the shift register units;
a second input terminal of the first-stage of the shift register units is connected with a second signal terminal, and except the first-stage of the shift register units, a second input terminal of the (N)th-stage of the shift register units is connected with an output terminal of an (N−1)th-stage of the shift register units; and
N is an integer greater than or equal to 3.

16. The shift register unit according to claim 13, further comprising a seventh transistor and an eighth transistor,
wherein a gate electrode of the seventh transistor is connected with the second node, a first electrode of the seventh transistor is connected with the first node, and a second electrode of the seventh transistor is connected with the first voltage terminal to receive the first voltage; and
a gate electrode of the eighth transistor is connected with the second node, a first electrode of the eighth transistor is connected with the output terminal, and a second electrode of the eighth transistor is connected with the first voltage terminal to receive the first voltage.

17. A driving method of a shift register unit, wherein the shift register unit comprises a first input sub-circuit, a first control sub-circuit, an output sub-circuit, and a second control sub-circuit,
wherein the first input sub-circuit is connected with a first input terminal, a first control signal terminal and the first control sub-circuit, and the first input sub-circuit is configured to output a first control signal of the first control signal terminal to the first control sub-circuit under control of a first input signal of the first input terminal;
the first control sub-circuit is connected with a second input terminal, a first node and the second control sub-circuit, the first control sub-circuit is configured to output a second input signal of the second input terminal to the first node under control of the first control signal output by the first input sub-circuit, or the first control sub-circuit is configured to output the second input signal to the second control sub-circuit;
the output sub-circuit is connected with the first node and an output terminal, and the output sub-circuit is configured to output an output signal to the output terminal under control of a level of the first node; and
the second control sub-circuit is connected with a second clock signal terminal, a second node, a control node and a first voltage terminal, the second control sub-circuit is configured to output a second clock signal to the second node under control of the second clock signal of the second clock signal terminal, or the second control sub-circuit is configured to output a first voltage of the first voltage terminal to the second node under control of a level of the control node;
the method comprises:
in an input phase, via the first input sub-circuit, outputting the first control signal of the first control signal terminal to the first control sub-circuit under control of the first input signal of the first input terminal, and via the second control sub-circuit, outputting the second clock signal of the second clock signal terminal to the second node under control of the second clock signal of the second clock signal terminal;
in a pre-charging phase, via the first control sub-circuit, outputting the second input signal of the second input terminal to the first node under control of the first control signal output by the first input sub-circuit; and via the first control sub-circuit, further outputting the second input signal of the second input terminal to the second control sub-circuit, and via the second control sub-circuit, outputting the first voltage of the first voltage terminal to the second node under control of the second input signal of the second input terminal; and
in an output phase, via the output sub-circuit, outputting the output signal to the output terminal under control of the level of the first node.

18. The driving method according claim 17, wherein the shift register unit further comprises a noise reduction sub-circuit, the driving method further comprises a reset phase,
in the input phase, via the noise reduction sub-circuit, outputting the first voltage of the first voltage terminal to the first node and the output terminal under control of the level of the second node; and
in the reset phase, via the second control sub-circuit, outputting the second clock signal to the second node under control of the second clock signal of the second clock signal terminal, and via the noise reduction sub-circuit, outputting the first voltage of the first voltage terminal to the first node and the output terminal under control of the level of the second node.

* * * * *